(12) United States Patent
Leobandung et al.

(10) Patent No.: US 9,627,271 B1
(45) Date of Patent: Apr. 18, 2017

(54) III-V COMPOUND SEMICONDUCTOR CHANNEL MATERIAL FORMATION ON MANDREL AFTER MIDDLE-OF-THE-LINE DIELECTRIC FORMATION

(71) Applicant: International Business Machines Corporation, Armonk, NY (US)

(72) Inventors: Effendi Leobandung, Stormville, NY (US); Renee T. Mo, Yorktown Heights, NY (US)

(73) Assignee: International Business Machines Corporation, Armonk, NY (US)

( * ) Notice: Subject to any disclaimer, the term of this patent is extended or adjusted under 35 U.S.C. 154(b) by 0 days.

(21) Appl. No.: 15/271,464

(22) Filed: Sep. 21, 2016

(51) Int. Cl.
*H01L 21/8238* (2006.01)
*H01L 29/66* (2006.01)
*H01L 21/306* (2006.01)
*H01L 21/308* (2006.01)

(52) U.S. Cl.
CPC .. *H01L 21/823821* (2013.01); *H01L 21/3085* (2013.01); *H01L 21/30604* (2013.01); *H01L 21/823857* (2013.01); *H01L 29/66545* (2013.01); *H01L 29/66795* (2013.01)

(58) Field of Classification Search
CPC ......... H01L 21/8238; H01L 21/823821; H01L 21/823852; H01L 21/30604; H01L 29/66795; H01L 29/66545
See application file for complete search history.

(56) References Cited

U.S. PATENT DOCUMENTS

| 9,142,651 | B1 * | 9/2015 | Xie ................... H01L 29/66818 |
| 2014/0231924 | A1 * | 8/2014 | Kuo ..................... H01L 29/785 257/401 |
| 2015/0155383 | A1 * | 6/2015 | Chang ................ H01L 29/7843 257/401 |
| 2016/0268158 | A1 * | 9/2016 | Leobandung ....... H01L 21/7682 |

* cited by examiner

*Primary Examiner* — Phuc Dang
(74) *Attorney, Agent, or Firm* — Scully, Scott, Murphy & Presser, P.C.; Louis J. Percello, Esq.

(57) ABSTRACT

A method is provided in which a III-V compound semiconductor channel material is grown from at least one exposed sidewall of a semiconductor mandrel that is present in an NFET device region. The III-V compound semiconductor channel material is grown after formation of any PFET devices and after formation of a middle-of-the-line (MOL) dielectric material within the NFET device region.

20 Claims, 21 Drawing Sheets

III-V COMPOUND SEMICONDUCTOR CHANNEL MATERIAL FORMATION ON MANDREL AFTER MIDDLE-OF-THE-LINE DIELECTRIC FORMATION

BACKGROUND

The present application relates to a method of forming a semiconductor structure. More particularly, the present application provides a method in which a III-V compound semiconductor channel material is grown from exposed sidewalls of a semiconductor mandrel within an NFET device region. The III-V compound semiconductor channel material is grown after formation of any PFET devices and after formation of a middle of-the-line (MOL) dielectric material within the NFET device region.

For more than three decades, the continued miniaturization of metal oxide semiconductor field effect transistors (MOSFETs) has driven the worldwide semiconductor industry. Various showstoppers to continue scaling have been predicated for decades, but a history of innovation has sustained Moore's Law in spite of many challenges. However, there are growing signs today that MOSFETs are beginning to reach their traditional scaling limits. Since it has become increasingly difficult to improve MOSFETs and therefore complementary metal oxide semiconductor (CMOS) performance through continued scaling, further methods for improving performance in addition to scaling have become critical.

The use of non-planar semiconductor devices such as, for example, semiconductor fin field effect transistors (Fin-FETs), is the next step in the evolution of complementary metal oxide semiconductor (CMOS) devices. Semiconductor FinFETs can achieve higher drive currents with increasingly smaller dimensions as compared to conventional planar FETs.

III-V compound semiconductors are one promising channel material for NFET devices because of their high-carrier mobility. In the prior art, it is known to grow III-V compound semiconductors from a sidewall of a semiconductor mandrel structure after formation of the sacrificial gate structure, but prior to forming the middle-of-the-line (MOL) dielectric material and replacing the sacrificial gate structure with a functional gate structure. In such processing, the grown III-V compound semiconductor material is not compatible with high processing temperatures that are typically required in forming PFET devices. As such, there is a need for providing a method in which III-V compound semiconductors can be grown from a sidewall of a semiconductor mandrel structure without being subjected to the high processing temperatures typically used in forming the PFET devices.

SUMMARY

A method is provided in which a III-V compound semiconductor channel material is grown from at least one exposed sidewall of a semiconductor mandrel that is present in an NFET device region. The III-V compound semiconductor channel material is grown after formation of any PFET devices and after formation of a middle-of-the-line (MOL) dielectric material within the NFET device region.

In one embodiment of the present application, the method may include providing, in an NFET device region, at least one sacrificial gate structure straddling over a portion of at least one semiconductor material portion. A source/drain structure is then formed from exposed sidewalls of each semiconductor material portion. Each semiconductor material portion not protected by the at least one sacrificial gate structure is removed, while maintaining at least a semiconductor mandrel beneath each sacrificial gate structure. Each semiconductor mandrel comprises a remaining portion of the semiconductor material portion. Next, a middle-of-the-line (MOL) dielectric material is formed laterally surrounding each sacrificial gate structure and atop each source/drain structure, wherein the MOL dielectric material has a topmost surface that is coplanar with each sacrificial gate structure. Each sacrificial gate structure is then removed to provide a cavity. Each cavity exposes at least one sidewall of each semiconductor mandrel. A III-V compound semiconductor channel material is then formed from the at least one sidewall of each semiconductor mandrel. Next, each semiconductor mandrel is removed to provide a gate cavity, and thereafter a functional gate structure is formed in each gate cavity.

DETAILED DESCRIPTION

Figure 1A:
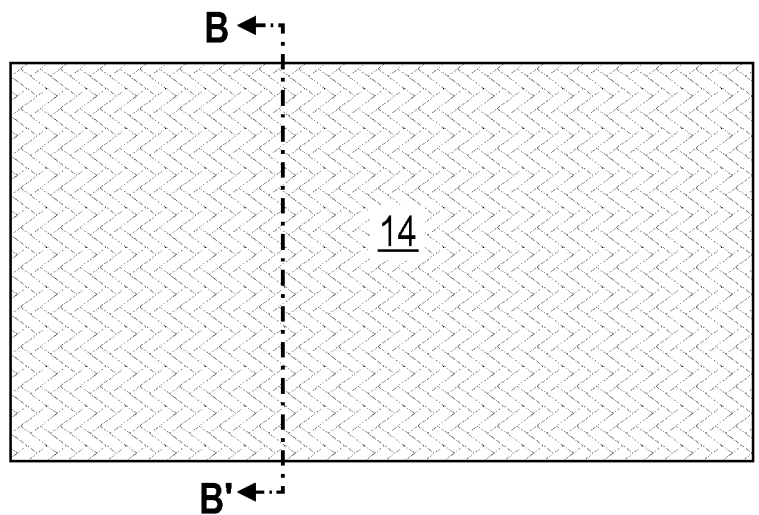
FIG. 1A is a top-down view of an exemplary semiconductor structure including, from bottom to top, a handle substrate, an insulator layer, and a semiconductor material layer that can be employed in accordance with an embodiment of the present application.

The present application will now be described in greater detail by referring to the following discussion and drawings that accompany the present application. It is noted that the drawings of the present application are provided for illustrative purposes only and, as such, the drawings are not drawn to scale. It is also noted that like and corresponding elements are referred to by like reference numerals.

In the following description, numerous specific details are set forth, such as particular structures, components, materials, dimensions, processing steps and techniques, in order to provide an understanding of the various embodiments of the present application. However, it will be appreciated by one of ordinary skill in the art that the various embodiments of the present application may be practiced without these specific details. In other instances, well-known structures or processing steps have not been described in detail in order to avoid obscuring the present application.

It will be understood that when an element as a layer, region or substrate is referred to as being "on" or "over" another element, it can be directly on the other element or intervening elements may also be present. In contrast, when an element is referred to as being "directly on" or "directly over" another element, there are no intervening elements present. It will also be understood that when an element is referred to as being "beneath" or "under" another element, it can be directly beneath or under the other element, or intervening elements may be present. In contrast, when an element is referred to as being "directly beneath" or "directly under" another element, there are no intervening elements present.

The present application illustrates an embodiment in which a III-V compound semiconductor channel material is formed along at least one sidewall of a semiconductor mandrel that is present in an NFET device region. In some embodiments, a PFET device region (not shown) would lie to the periphery of the NFET device region illustrated in the drawings of the present application. The PFET device region is not shown so at to avoid obscuring the method of the present application.

Figure 1B:
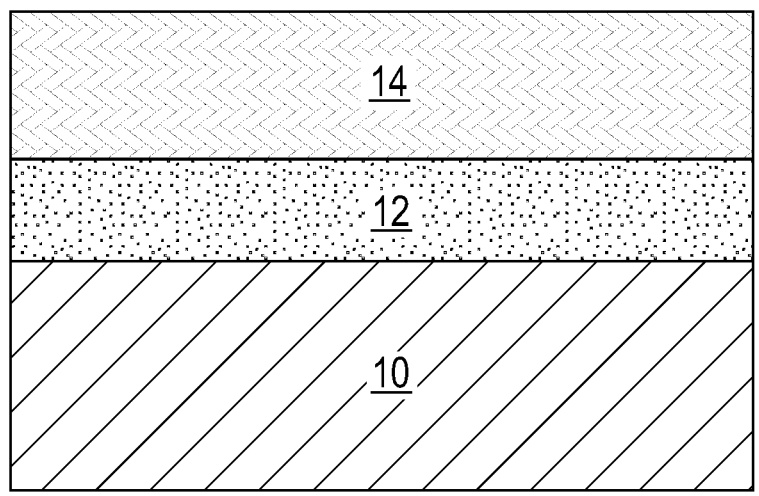
FIG. 1B is a cross sectional view of the exemplary semiconductor structure of FIG. 1A along vertical plane B-B'.

Referring to FIGS. 1A-1B, there are illustrated various views of an exemplary semiconductor structure that can employed in accordance with an embodiment of the present application. The exemplary semiconductor structure shown in FIGS. 1A-1B includes from bottom to top, a handle substrate 10, an insulator layer 12, and a semiconductor material layer 14. Collectively, the handle substrate 10, the insulator layer 12, and the semiconductor material layer 14 may be referred to as a semiconductor-on-insulator (SOI) substrate. Although the present application is described and illustrated utilizing an SOI substrate, other semiconductor substrates can also be used including, for example, a semiconductor substrate in which handle substrate 10 is omitted, or a bulk semiconductor substrate in which the entirety of the semiconductor substrate is comprised of at least one semiconductor material having semiconducting properties.

In the embodiment illustrated in FIGS. 1A-1B, the semiconductor material layer 14 is present on an uppermost surface of the insulator layer 12. The insulator layer 12 is present on an uppermost surface of the handle substrate 10. The handle substrate 10 provides mechanical support to the insulator layer 12 and the semiconductor material layer 14.

In some embodiments of the present application, the handle substrate 10 and the semiconductor material layer 14 of the SOI substrate may comprise a same semiconductor material. In other embodiments of the present application, the handle substrate 10 and the semiconductor material layer 14 of the SOI substrate may comprise a different semiconductor material. The term "semiconductor" as used herein in connection with the semiconductor material of the handle substrate 10 and the semiconductor material layer 14 denotes any semiconductor material having semiconductor properties including, for example, Si, Ge, SiGe, SiC, SiGeC, III/V compound semiconductors or II-VI compound semiconductors. Multilayers of these semiconductor materials can also be used as the semiconductor material of the handle substrate 10 and/or the semiconductor material layer 14. In one embodiment, the handle substrate 10 and the semiconductor material layer 14 are both comprised of silicon. In some embodiments, the handle substrate 10 is a non-semiconductor material including, for example, a dielectric material and/or a conductive material.

When the handle substrate 10 is composed of a semiconductor material, the handle substrate 10 and the semiconductor material layer 14 may have the same or different crystal orientation. For example, the crystal orientation of the handle substrate 10 and/or the semiconductor material layer 14 may be {100}, {110}, or {111}. Other crystallographic orientations besides those specifically mentioned can also be used in the present application. In a preferred embodiment, the semiconductor layer 14 has a {110} crystal orientation. The handle substrate 10 and/or the semiconductor material layer 14 of the SOI substrate may be a single crystalline semiconductor material, a polycrystalline material, or an amorphous material. Typically, at least the semiconductor material layer 14 is a single crystalline semiconductor material.

The insulator layer 12 of the SOI substrate may be a crystalline or non-crystalline dielectric material such as, for example, an oxide or a nitride. In one embodiment, the insulator layer 12 is an oxide such as, for example, silicon dioxide. In another embodiment, the insulator layer 12 may be composed of boron nitride. In yet another embodiment, the insulator layer 12 is composed of a multilayered stack of, and in any order, silicon dioxide and boron nitride.

The SOI substrate may be formed utilizing standard processes including for example, SIMOX (separation by ion implantation of oxygen) or layer transfer. When a layer transfer process is employed, an optional thinning step may follow the bonding of two semiconductor wafers together. The optional thinning step reduces the thickness of the semiconductor material layer to a layer having a thickness that is more desirable.

In one embodiment, the thickness of semiconductor material layer 14 of the SOI substrate is typically from 10 nm to 100 nm; other thicknesses that are lesser than 10 nm or greater than 100 nm can also be used as the thickness of the semiconductor material layer 14. For example, and when an ETSOI (extremely thin semiconductor-on-insulator) substrate is employed, semiconductor material layer 14 of the SOI can have a thickness of less than 10 nm.

In some embodiments, the insulator layer 12 of the SOI substrate has a thickness from 1 nm to 200 nm; although other thicknesses that are lesser than, or greater than, the aforementioned thickness range may also be used as the insulator layer 12. The thickness of the handle substrate 10 of the SOI substrate is inconsequential to the present application.

Figure 2A:
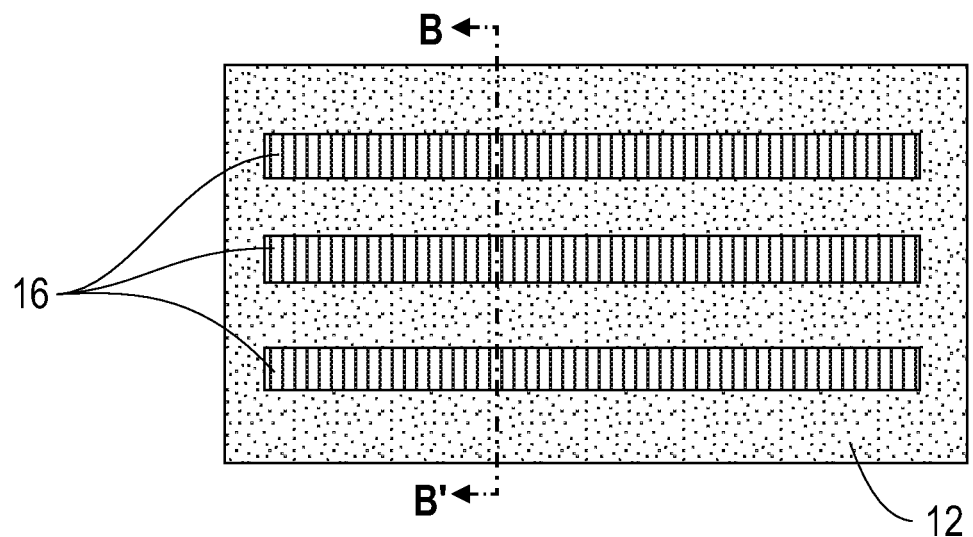
FIG. 2A is a top-down view of the exemplary semiconductor structure of FIGS. 1A-1B after formation of a hard mask layer, and patterning the hard mask layer and the semiconductor material layer to provide at least one patterned material stack of, from bottom to top, a remaining portion of the semiconductor material layer and a remaining portion of the hard mask layer.
Figure 2B:
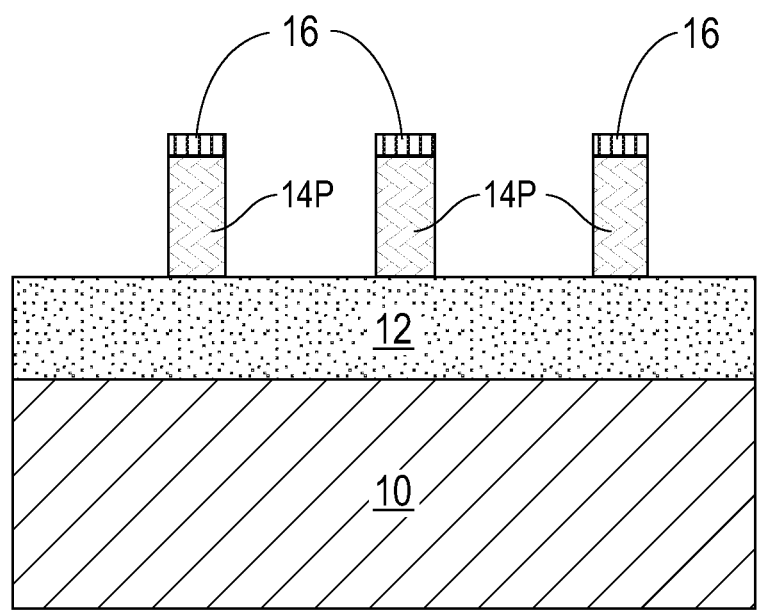
FIG. 2B is a cross sectional view of the exemplary semiconductor structure of FIG. 2A along vertical plane B-B'.

Referring now to FIGS. 2A-2B, there are illustrated various views of the exemplary semiconductor structure of FIGS. 1A-1B after formation of a hard mask layer (not specifically shown), and patterning the hard mask layer and the semiconductor material layer to provide at least one patterned material stack of, from bottom to top, a remaining portion of the semiconductor material layer and a remaining portion of the hard mask layer. In the present application, three patterned material stacks are shown by way of one example. The remaining portion of the semiconductor material layer may be referred to as a semiconductor material portion 14P, while the remaining portion of the hard mask layer may be referred to as a hard mask 16. In some embodiments, the formation of the hard mask layer can be omitted. In such an embodiment, the patterning only provides at least one semiconductor material portion 14P.

In the illustrated embodiment, the hard mask layer that provides hard mask 16 may include any hard mask material such as, for example, silicon dioxide, silicon nitride and/or silicon oxynitride. The hard mask layer is a continuous layer that covers the entirety of the semiconductor material layer 14. In some embodiments, the hard mask layer that provides hard mask 16 may be formed utilizing a deposition process such as, for example, chemical vapor deposition or plasma enhanced chemical vapor deposition. In other embodiments, the hard mask layer that provides hard mask 16 may be formed utilizing a thermal process such as, for example, thermal oxidation and/or thermal nitridation. In yet other embodiments, the hard mask layer that provides hard mask 16 can be formed utilizing a combination of a deposition process and a thermal process. The thickness of the hard mask layer that provides hard mask 16 can range from 20 nm to 100 nm, although lesser and greater thicknesses can also be employed.

After forming the hard mask layer, the hard mask layer and the semiconductor material layer 14 are patterned. In one embodiment, patterning may be performed utilizing lithography and etching. Lithography includes forming a photoresist (not shown) atop a material or material stack to be patterned, exposing the photoresist to a desired pattern of radiation, and developing the exposed photoresist utilizing a conventional photoresist developer to provide a patterned photoresist. The photoresist may be a positive-tone photoresist, a negative-tone photoresist or a hybrid-tone photoresist. The photoresist may be formed utilizing a conventional deposition process such as, for example, spin-on coating. The etch used in the patterning process may include a dry etching process (such as, for example, reactive ion etching, ion beam etching, plasma etching or laser ablation), a wet chemical etch process or any combination of dry and wet etching. The patterned photoresist may be removed from the structure anytime after the pattern has been transferred into the hard mask layer. The patterned photoresist may be removed utilizing any conventional resist stripping process such as, for example, ashing.

In another embodiment, patterning may be achieved utilizing a sidewall image transfer (SIT) process. The SIT process includes forming a mandrel material layer (not shown) atop the material or material layers that are to be patterned. The mandrel material layer (not shown) can include any material (semiconductor, dielectric or conductive) that can be selectively removed from the structure during a subsequently performed etching process. In one embodiment, the mandrel material layer (not shown) may be composed of amorphous silicon or polysilicon. In another embodiment, the mandrel material layer (not shown) may be composed of a metal such as, for example, Al, W, or Cu. The mandrel material layer (not shown) can be formed, for example, by chemical vapor deposition or plasma enhanced chemical vapor deposition. Following deposition of the mandrel material layer (not shown), the mandrel material layer (not shown) can be patterned by lithography and etching to form a plurality of mandrel structures (also not shown) on the topmost surface of the structure. The SIT process continues by forming a spacer on each sidewall of each mandrel structure. The spacer can be formed by deposition of a spacer material that has a different etch selectivity than the mandrel material and then etching the deposited spacer material. In one embodiment, the spacer material may comprise any dielectric spacer material such as, for example, silicon dioxide, silicon nitride or a dielectric metal oxide. Examples of deposition processes that can be used in providing the spacer material include, for example, chemical vapor deposition (CVD), plasma enhanced chemical vapor deposition (PECVD), or atomic layer deposition (ALD). Examples of etching that be used in providing the spacers include any etching process such as, for example, reactive ion etching.

After formation of the spacers, the SIT process continues by removing each mandrel structure. Each mandrel structure can be removed by an etching process that is selective for removing the mandrel material. Following the mandrel structure removal, the SIT process continues by transferring the pattern provided by the spacers into the underlying material or material layers. The pattern transfer may be achieved by utilizing at least one etching process including, dry etching and/or a chemical wet etch process. Upon completion of the pattern transfer, the SIT process concludes by removing the spacers from the structure. Each spacer may be removed by etching or a planarization process.

After patterning the hard mask layer and the semiconductor material layer 14, the hard mask 16 and the semiconductor material portion 14P of each patterned material stack have sidewalls that are vertically aligned to each other. Thus, the hard mask 16 and semiconductor material portion 14P of each patterned material stack have identical widths.

In some embodiments, each semiconductor material portion 14P may be a semiconductor fin. As used herein, a "semiconductor fin" refers to a semiconductor structure that includes a pair of vertical sidewalls that are parallel to each other. As used herein, a surface is "vertical" if there exists a vertical plane from which the surface does not deviate by more than three times the root mean square roughness of the surface.

In one embodiment of the present application, each semiconductor material portion 14P has a width from 5 nm to 50 nm. Other widths that are lesser than, or greater than the range mentioned herein can also be used in the present application. Each semiconductor material portion 14P can be spaced apart from its nearest neighboring semiconductor material portion 14P by a pitch of from 20 nm to 100 nm. Each patterned material stack (14P, 16) is oriented parallel to each other. The sidewalls of semiconductor material portion 14P can be of any crystalline orientation. In one example, the sidewall of the semiconductor material portion 14P has a (111) crystal orientation which enables smooth growth of a III-V compound semiconductor channel material.

If a PFET device region is present, at least one patterned material stack can be formed in the PFET device region (not shown). In some embodiments, the at least one patterned material stack that is present in the PFET device may include the hard mask 16 and the semiconductor material portion 14P. In other embodiments, the at least one patterned material stack that is present in the PFET device may include only the semiconductor material portion 14P.

Figure 3A:
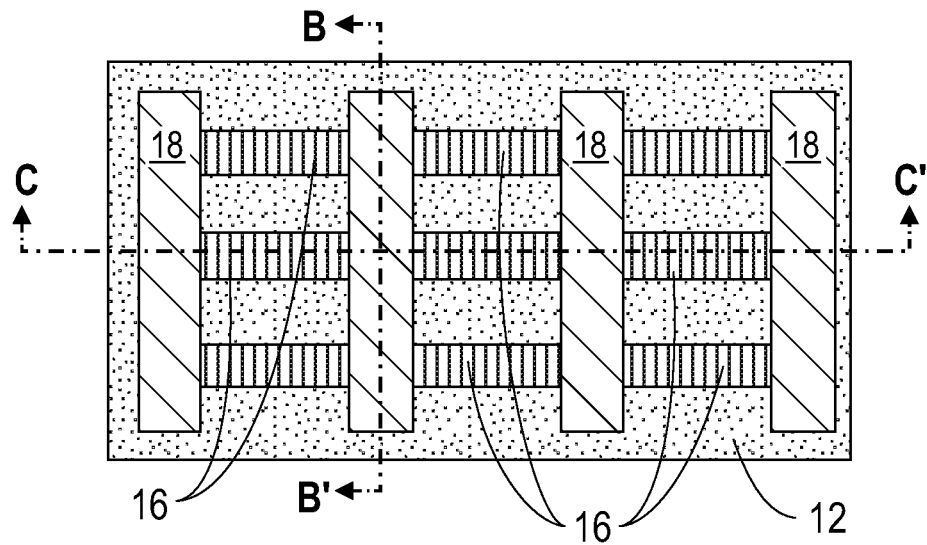
FIG. 3A is a top-down view of the exemplary semiconductor structure of FIGS. 2A-2B after formation of at least one sacrificial gate structure straddling over a portion of the at least one patterned material stack.
Figure 3B:
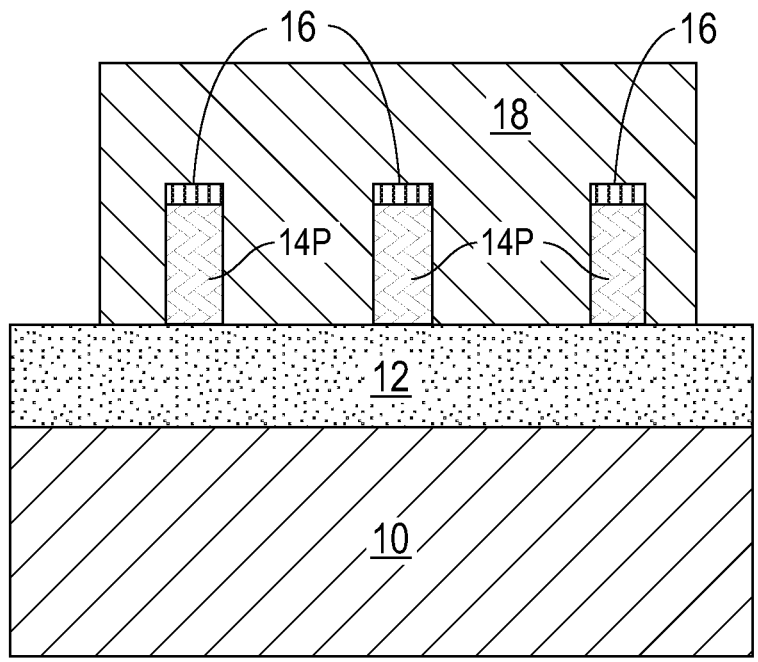
FIG. 3B is a cross sectional view of the exemplary semiconductor structure of FIG. 3A along vertical plane B-B'.
Figure 3C:
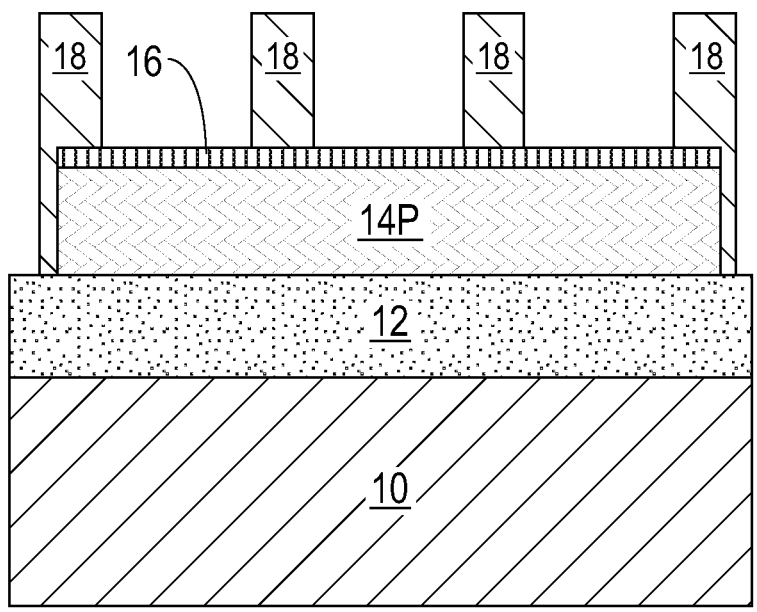
FIG. 3C is a cross sectional view of the exemplary semiconductor structure of FIG. 2A along vertical plane C-C'.

Referring now to FIGS. 3A-3C, there are illustrated various views of the exemplary semiconductor structure of FIGS. 2A-2B after formation of at least one sacrificial gate structure 18 straddling over a portion of the at least one patterned material stack (14P, 16). In the present application, four sacrificial gate structures 18 are shown by way of one example. Each sacrificial gate structure 18 lies perpendicular to each patterned material stack (14P, 16).

By "straddling over" it is meant that one material is formed atop and along sidewall surfaces of another material. By "sacrificial gate structure" it is meant a material or material stack that serves as a placeholder for a subsequently formed functional gate structure. By "functional gate structure" it is meant a permanent gate structure used to control output current (i.e., flow of carriers in the channel) of a semiconducting device through electrical or magnetic fields.

The at least one sacrificial gate structure 18 may include one or more sacrificial gate materials including, but not limited to, a dielectric material and/or a metal. For example, the at least one sacrificial gate structure 18 may be composed of amorphous carbon, a porous oxide, aluminum, tungsten or copper. The at least one sacrificial gate structure 18 can be formed by first providing one or more sacrificial gate material layers utilizing a deposition process such as, for example, chemical vapor deposition or plasma enhanced chemical vapor deposition. After providing the one or more sacrificial gate material layers, the one or more sacrificial gate material layers can be patterned forming the at least one sacrificial gate structure 18. Patterning may be performed utilizing lithography and etching as described above.

If a PFET device region is present, sacrificial gate structures 18 are also formed in the PFET device region (not shown). In some embodiments of the present application and in the PFET device region (not shown), source/drain regions (also not shown) can now be formed from exposed sidewalls of each semiconductor material portion within the PFET device region utilizing an epitaxial growth (or deposition)

process to be defined in greater detail herein below. After the sacrificial gate structure 18 formation, and in the PFET device region only, a gate spacer can be formed as well as formation of source/drain regions. The source/drain region in the PFET device region can be formed by epitaxy and/or implantation and/or annealing.

Figure 4A:
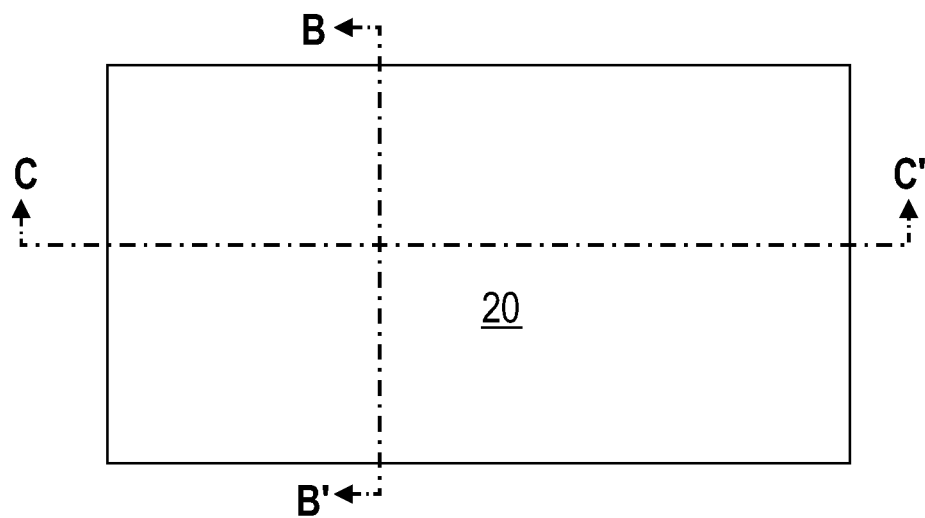
FIG. 4A is a top-down view of the exemplary semiconductor structure of FIGS. 3A-3C after forming a dielectric material layer.
Figure 4B:
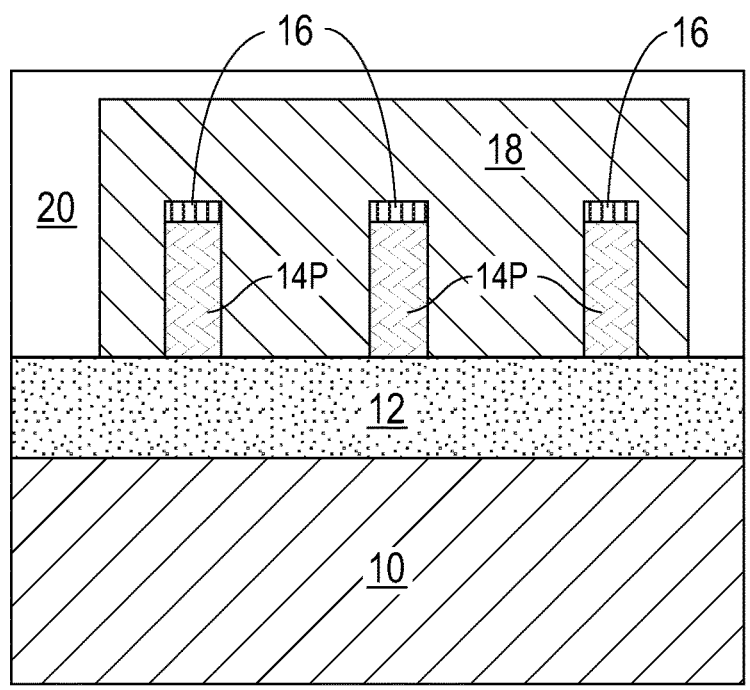
FIG. 4B is a cross sectional view of the exemplary semiconductor structure of FIG. 4A along vertical plane B-B'.
Figure 4C:
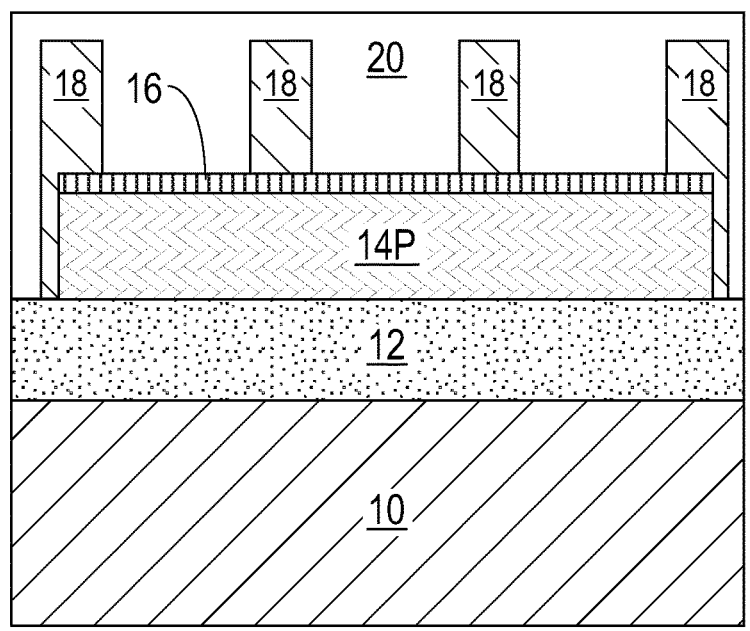
FIG. 4C is a cross sectional view of the exemplary semiconductor structure of FIG. 4A along vertical plane C-C'.

Referring now to FIGS. 4A-4C, there is illustrated the exemplary semiconductor structure of FIGS. 3A-3C after forming a dielectric material layer 20; the dielectric material layer 20 is also formed in the PFET device region if the same is present. This step may be omitted when no PFET device region is present. The dielectric material layer 20 may be composed of, for example, silicon dioxide, undoped silicate glass (USG), fluorosilicate glass (FSG), borophosphosilicate glass (BPSG), a spin-on low-k dielectric layer, a chemical vapor deposition (CVD) low-k dielectric layer or any combination thereof. The term "low-k" as used throughout the present application denotes a dielectric material that has a dielectric constant of less than silicon dioxide. In another embodiment, a self-planarizing material such as a spin-on glass (SOG) or a spin-on low-k dielectric material such as SiLK™ can be used as the dielectric material layer 20. The use of a self-planarizing dielectric material as dielectric material layer 20 may avoid the need to perform a subsequent planarizing step.

In one embodiment, the dielectric material layer 20 can be formed utilizing a deposition process including, for example, chemical vapor deposition (CVD), plasma enhanced chemical vapor deposition (PECVD), evaporation or spin-on coating. In some embodiments, a planarization process or an etch back process follows the deposition of the dielectric material layer 20. The thickness of the dielectric material layer 20 that can be employed in the present application may vary depending on the type of dielectric material employed as well as the method that was employed in forming the same. In one embodiment, the dielectric material layer 20 has a thickness from 80 nm to 500 nm. Other thicknesses that are greater or lesser than the range provided above can also be used for the dielectric material layer 20.

In some embodiments of the present application and in the PFET device region (not shown), each sacrificial gate structure can now be removed and replaced with a functional gate structure. Thus, a PFET device is formed in the PFET device region utilizing a replacement gate process. The PFET device may include a gate dielectric material portion and a gate conductor portion as defined below.

Figure 5A:
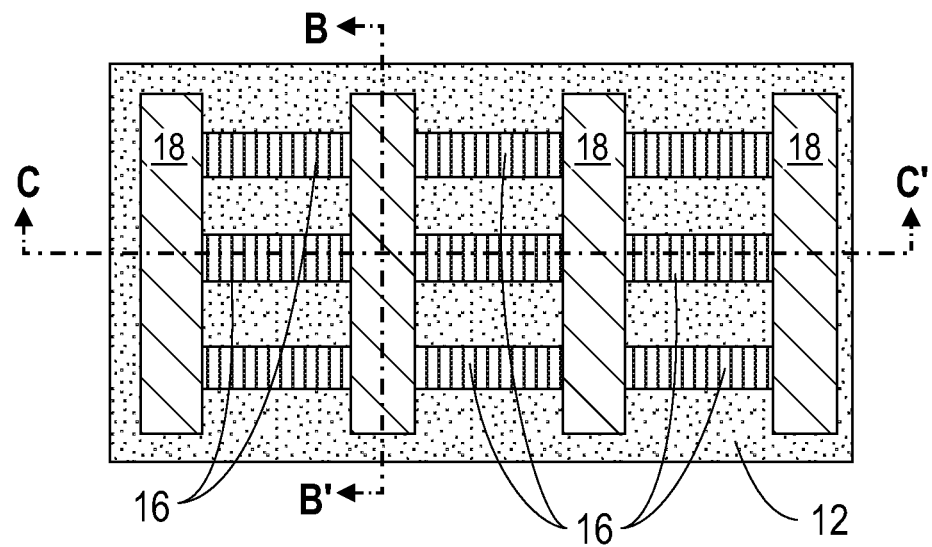
FIG. 5A is a top-down view of the exemplary semiconductor structure of FIGS. 4A-4C after removing the dielectric material layer.
Figure 5B:
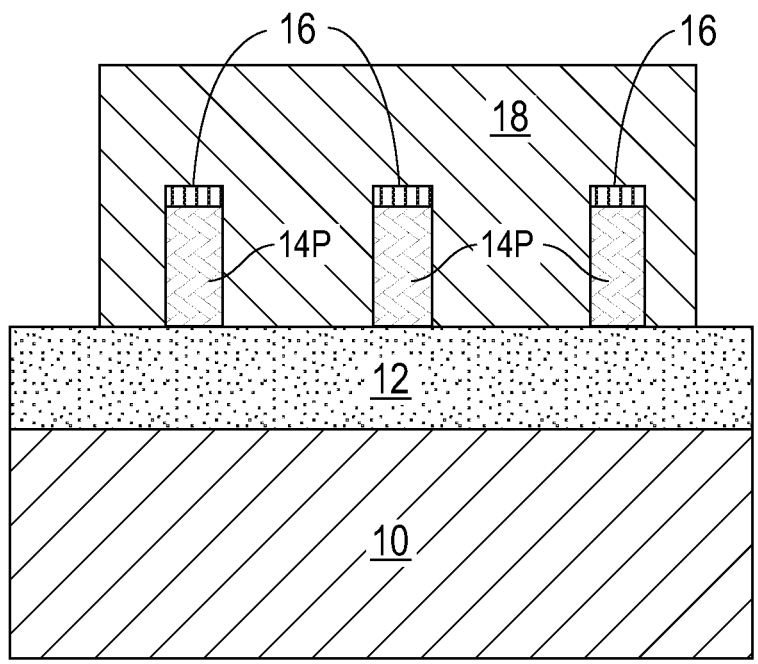
FIG. 5B is a cross sectional view of the exemplary semiconductor structure of FIG. 5A along vertical plane B-B'.
}
Figure 5C:
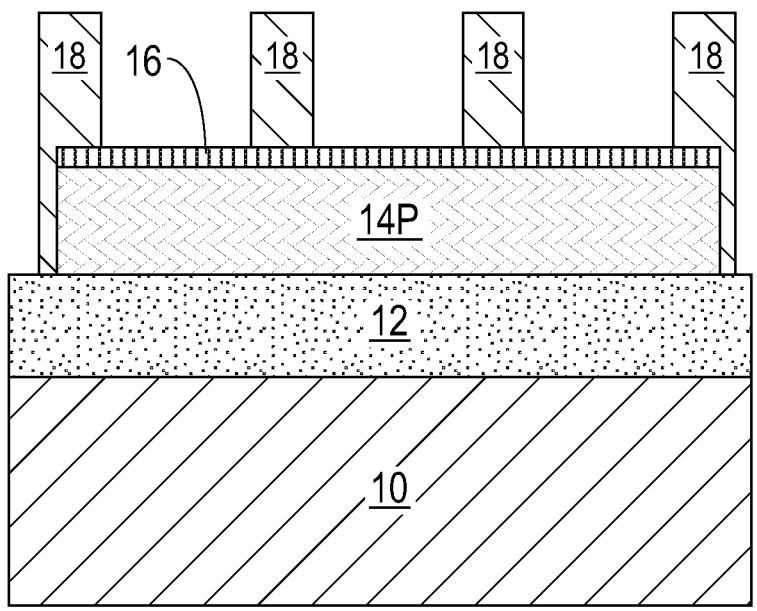
FIG. 5C is a cross sectional view of the exemplary semiconductor structure of FIG. 5A along vertical plane C-C'.
Figure 6A:
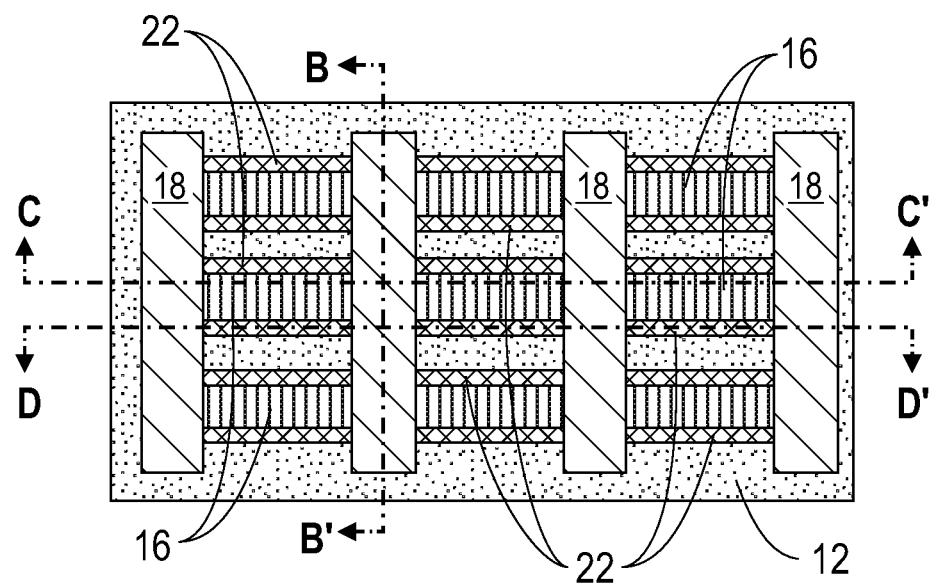
FIG. 6A is a top-down view of the exemplary semiconductor structure of FIGS. 5A-5C after forming a source/drain structure from each exposed sidewall of the remaining portion of the semiconductor material layer of the at least one patterned material stack.
Figure 6B:
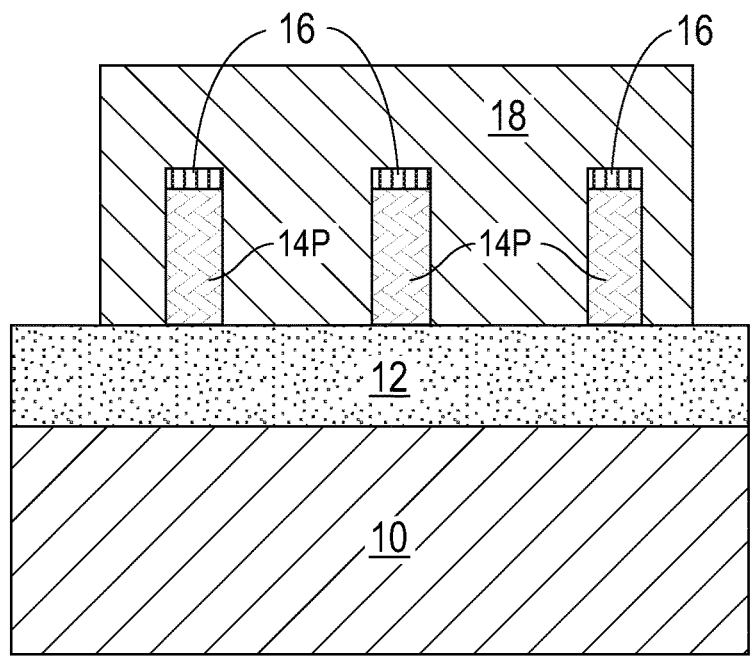
FIG. 6B is a cross sectional view of the exemplary semiconductor structure of FIG. 6A along vertical plane B-B'.
Figure 6C:
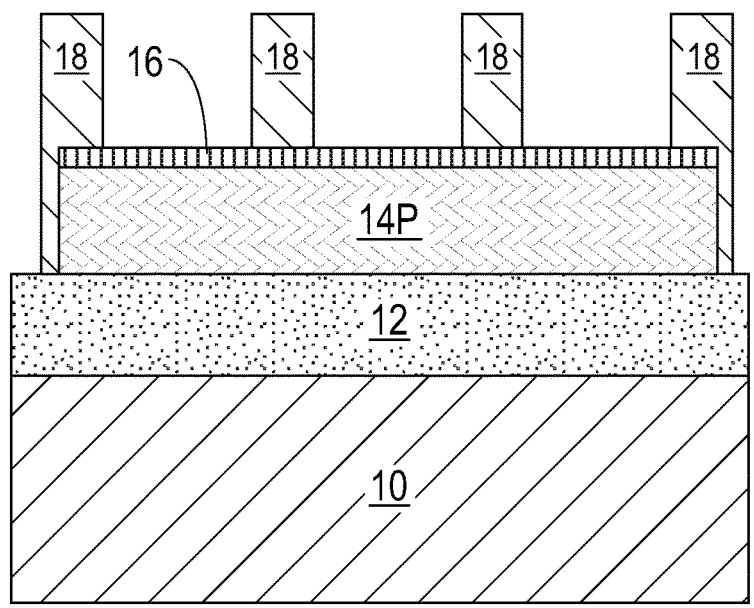
FIG. 6C is a cross sectional view of the exemplary semiconductor structure of FIG. 6A along vertical plane C-C'.
Figure 6D:
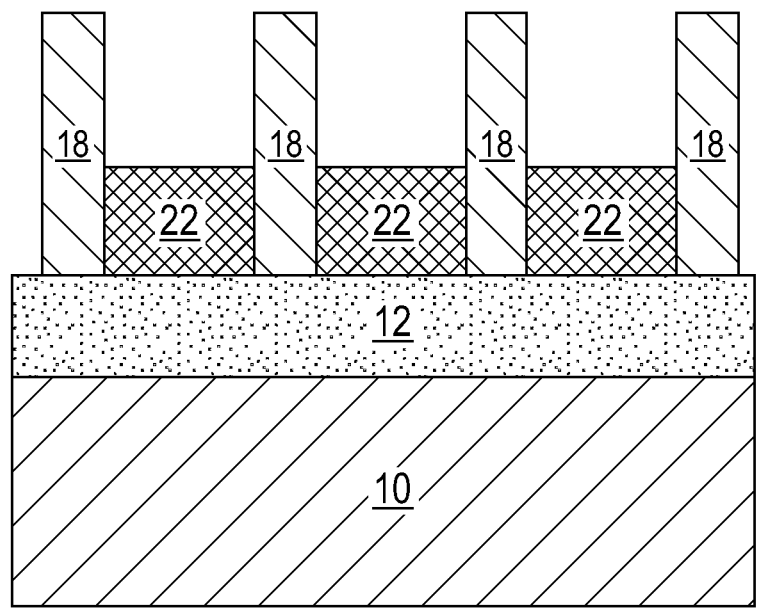
FIG. 6D is a cross sectional view of the exemplary semiconductor structure of FIG. 6A along vertical plane D-D'.
Figure 7A:
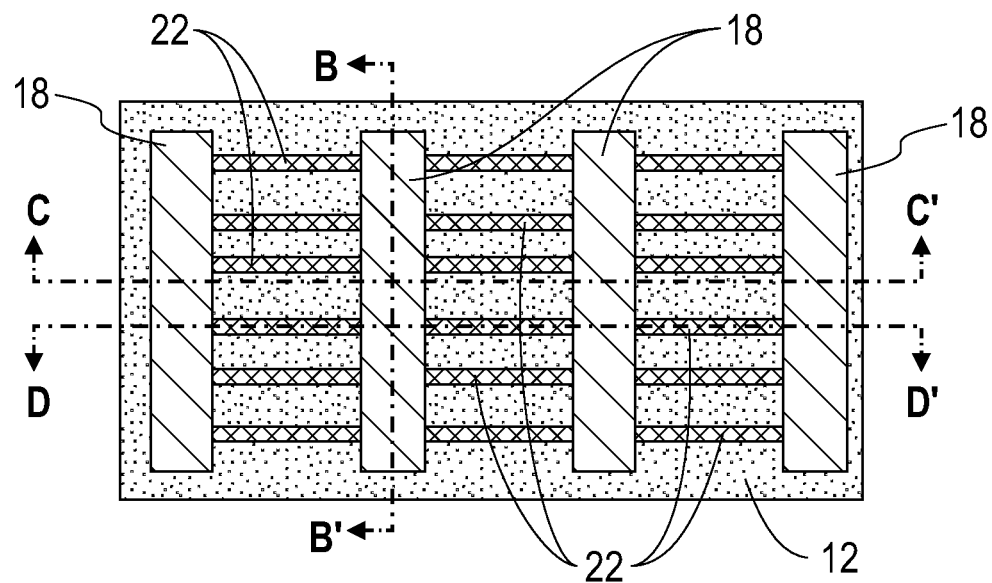
FIG. 7A is a top-down view of the exemplary semiconductor structure of FIGS. 6A-6C after removing exposed portions of the at least one patterned material stack that are not protected by a sacrificial gate structure.
Figure 7B:
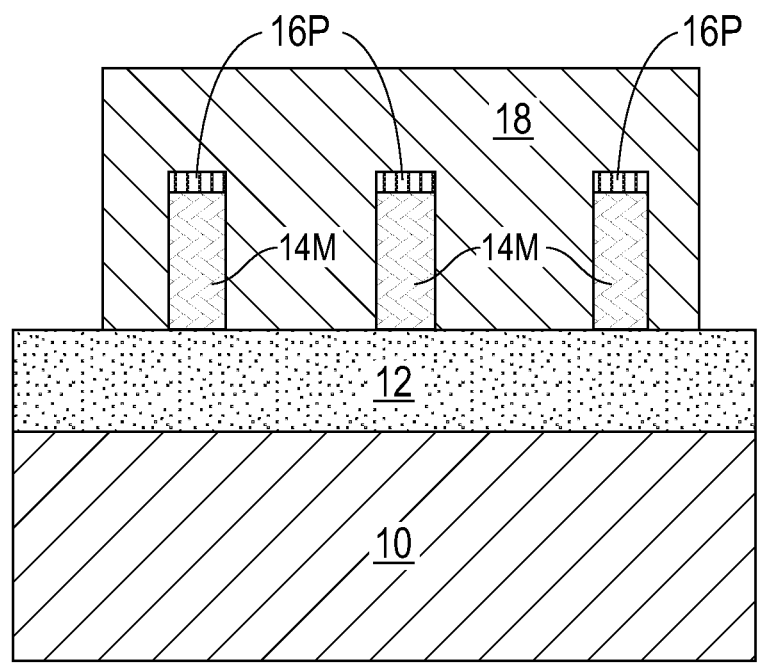
FIG. 7B is a cross sectional view of the exemplary semiconductor structure of FIG. 7A along vertical plane B-B'.
Figure 7C:
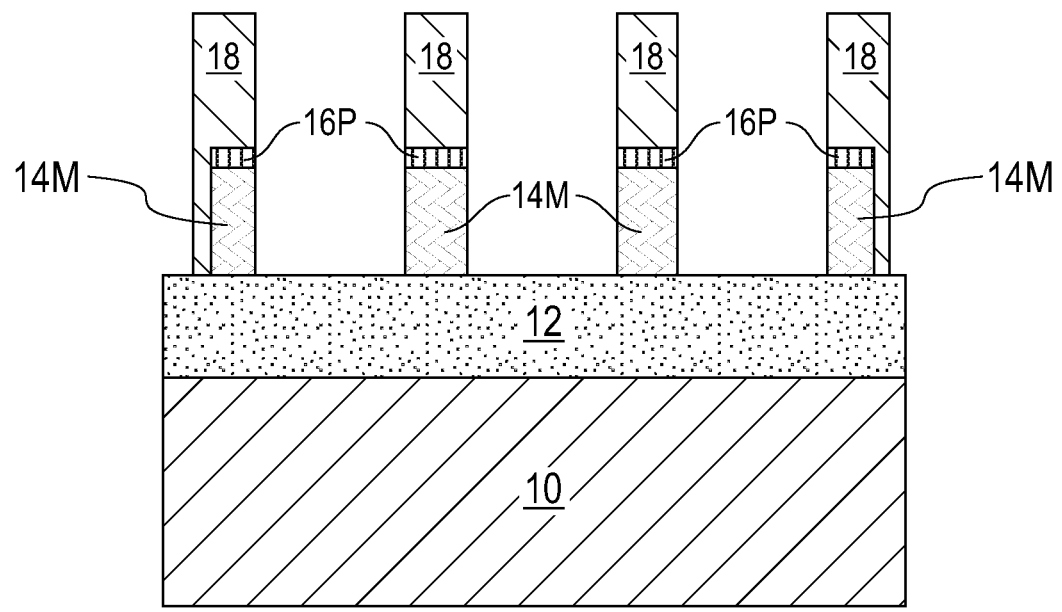
FIG. 7C is a cross sectional view of the exemplary semiconductor structure of FIG. 7A along vertical plane C-C'.
Figure 7D:
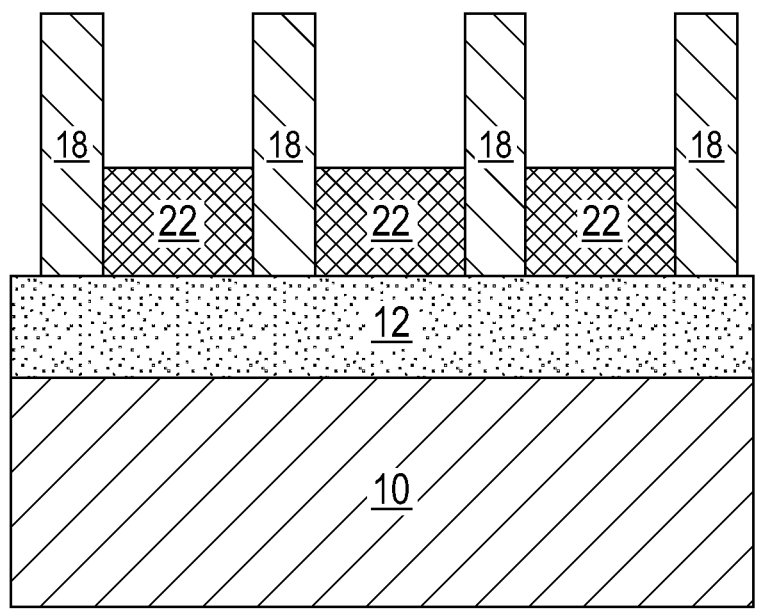
FIG. 7D is a cross sectional view of the exemplary semiconductor structure of FIG. 7A along vertical plane D-D'.
Figure 8A:
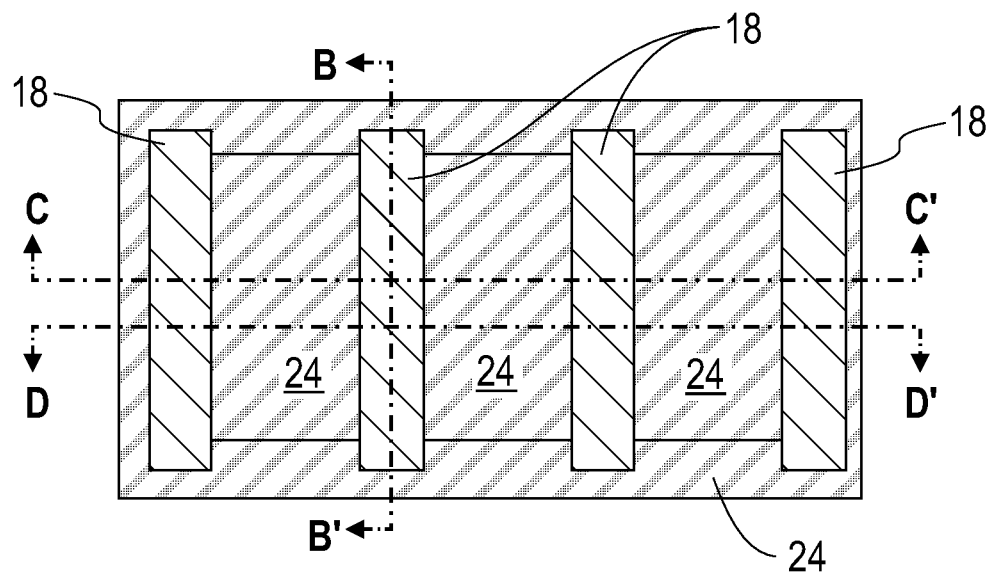
FIG. 8A is a top-down view of the exemplary semiconductor structure of FIGS. 7A-7D after forming a middle-of-the-line (MOL) dielectric material, the MOL dielectric material laterally surrounding each sacrificial gate structure and having a topmost surface that is coplanar with the topmost surface of each sacrificial gate structure.
Figure 8B:
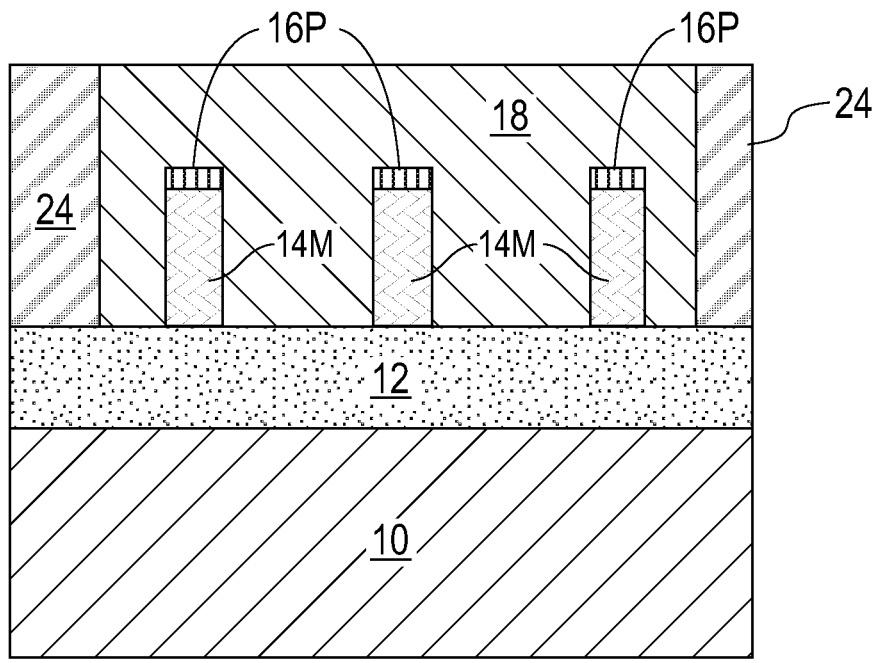
FIG. 8B is a cross sectional view of the exemplary semiconductor structure of FIG. 8A along vertical plane B-B'.
Figure 8C:
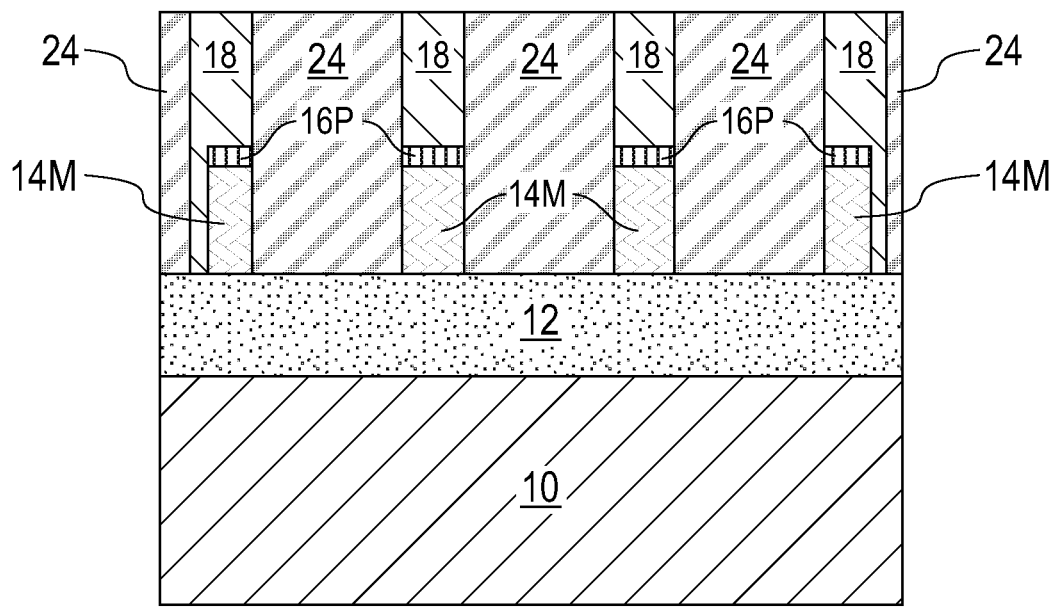
FIG. 8C is a cross sectional view of the exemplary semiconductor structure of FIG. 8A along vertical plane C-C'.
Figure 8D:
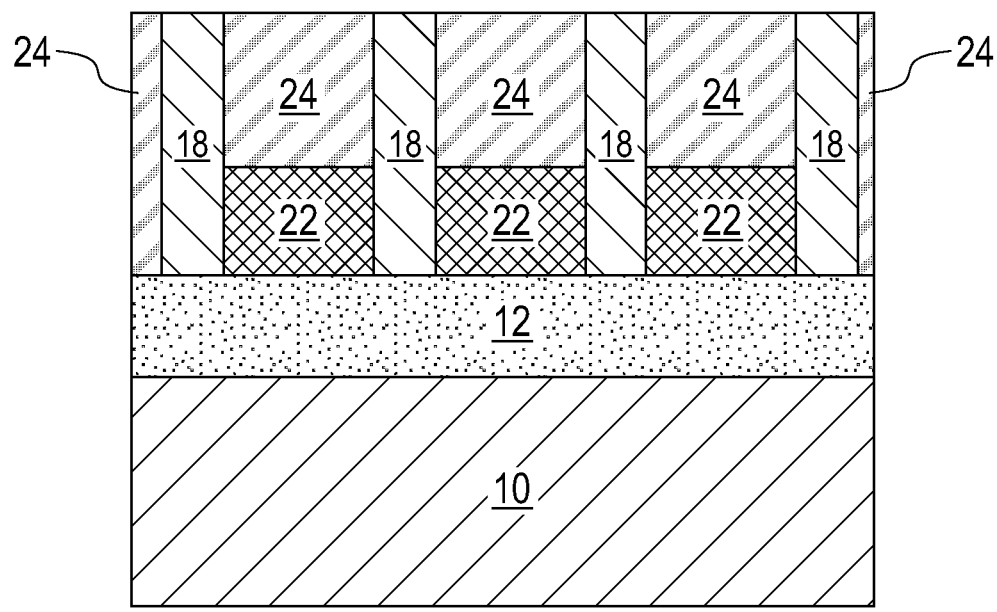
FIG. 8D is a cross sectional view of the exemplary semiconductor structure of FIG. 8A along vertical plane D-D'.
Figure 9A:
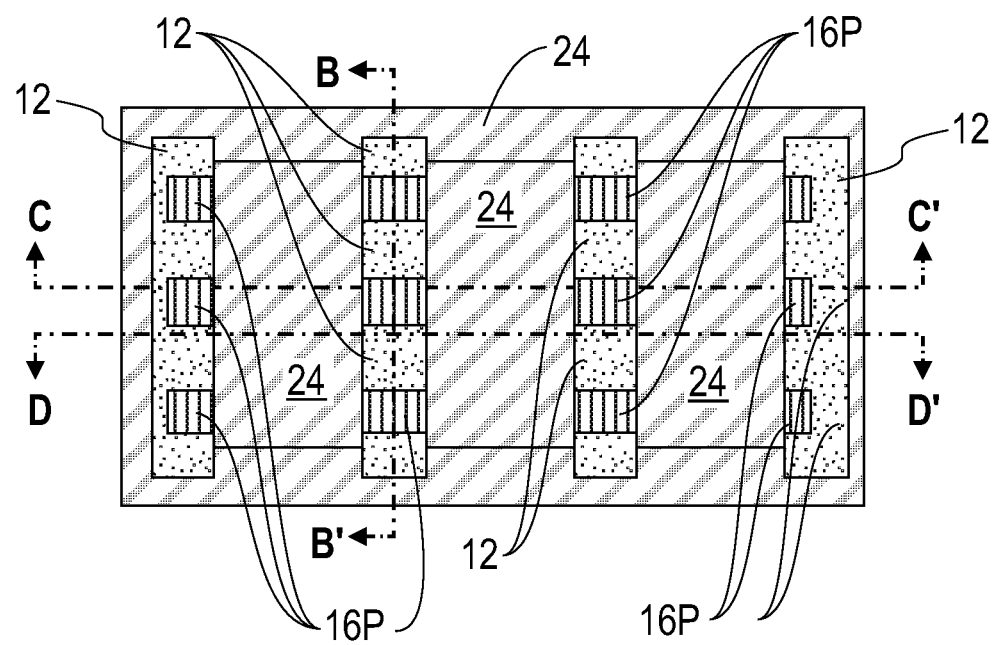
FIG. 9A is a top-down view of the exemplary semiconductor structure of FIGS. 8A-8D after removing each sacrificial gate structure.
Figure 9B:
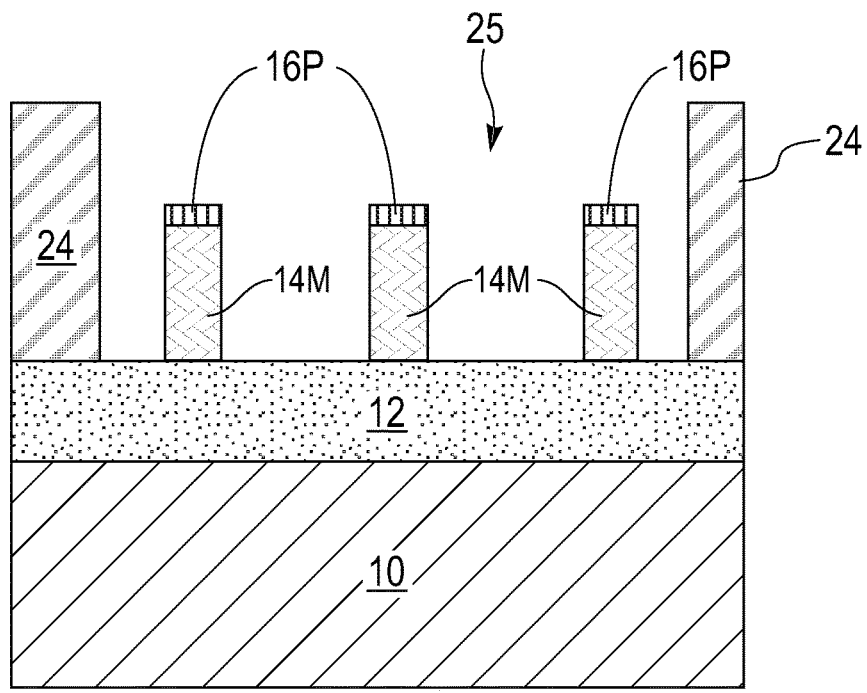
FIG. 9B is a cross sectional view of the exemplary semiconductor structure of FIG. 9A along vertical plane B-B'.
Figure 9C:
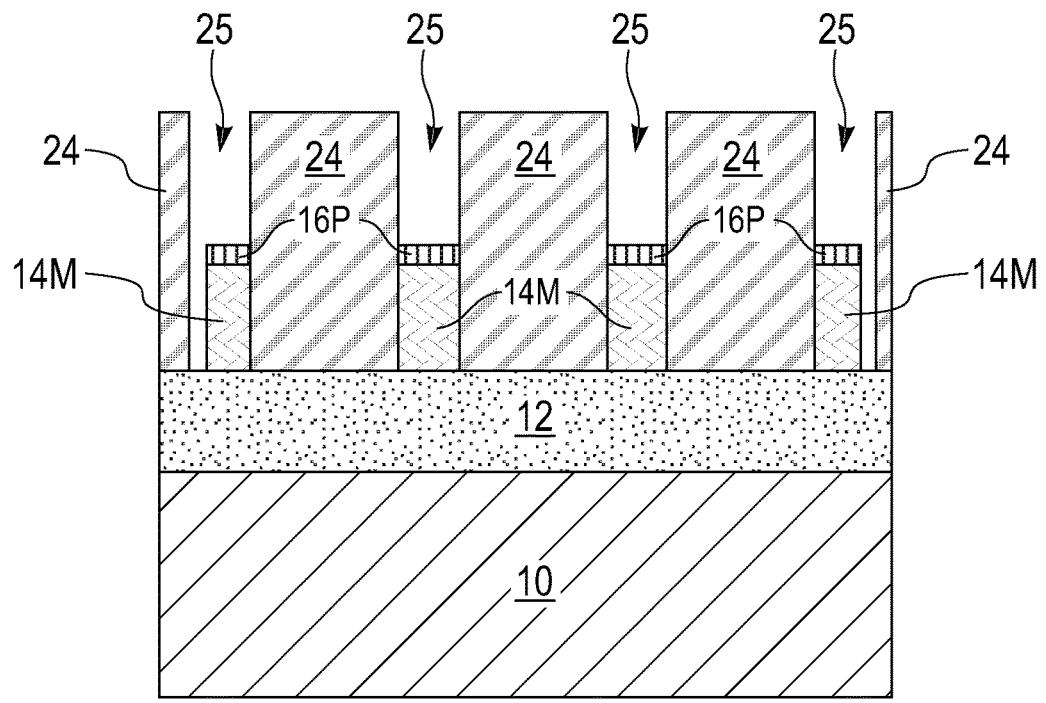
FIG. 9C is a cross sectional view of the exemplary semiconductor structure of FIG. 9A along vertical plane C-C'.
Figure 9D:
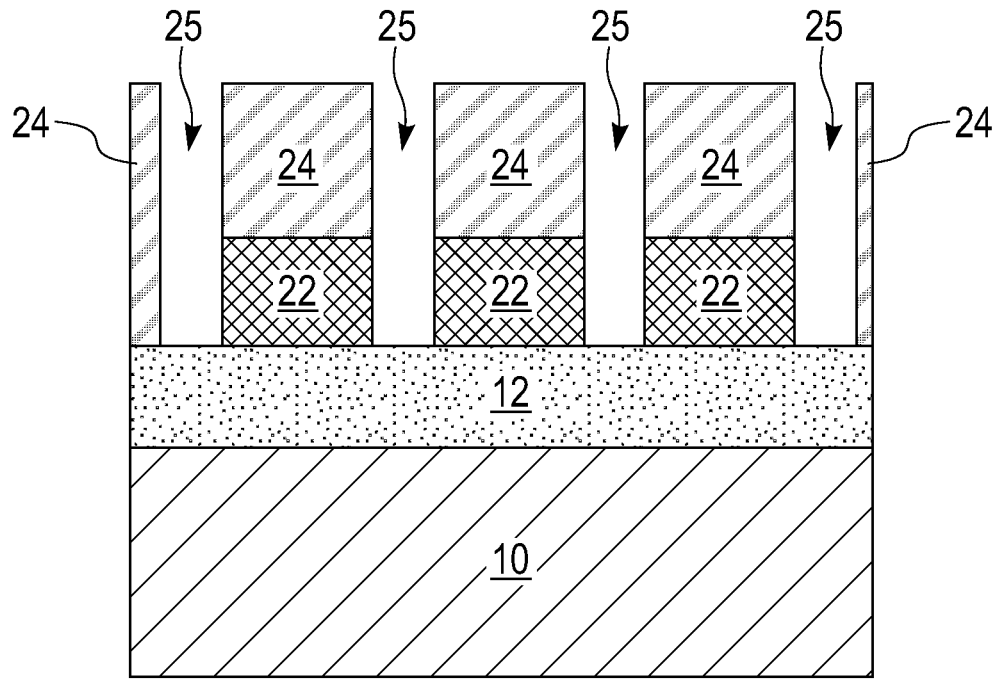
FIG. 9D is a cross sectional view of the exemplary semiconductor structure of FIG. 9A along vertical plane D-D'.

Referring now FIGS. 5A-5C, there is illustrated various views of the exemplary semiconductor structure of FIGS. 4A-4C after removing the dielectric material layer 20; if the PFET device region is present, the dielectric material layer 20 may remain in the PFET device region. In some embodiments of the present application, and when no PFET device region is present, the processing steps of forming the dielectric material layer 20 and removal of the dielectric material layer 20 may be omitted. The dielectric material layer 20 can be removed utilizing an etching process that is selective in removing the dielectric material layer 20. In one example, an anisotropic etch such as a reactive ion etch can be used in removing the dielectric material layer 20. In embodiments in which a PFET device region is present, a block mask can be formed over the PFET device region at this point of the present application.

Referring now to FIGS. 6A-6D, there are illustrated various views of the exemplary semiconductor structure of FIGS. 5A-5C after forming a source/drain structure 22 from each exposed sidewall of the remaining portion of the semiconductor material layer (semiconductor semiconductor material portion 14P) of the at least one patterned material stack.

Each source/drain structure 22 comprises a semiconductor material and an n-type dopant. The semiconductor material that provides the source/drain structure 22 may include a same semiconductor material as, or a different semiconductor material from, the semiconductor material that provides each semiconductor material portion 14P. In one example, and when the semiconductor material that provides each semiconductor material portion 14P is composed of silicon, each source/drain structure 22 may be composed of a III-V compound semiconductor such as, for example, InGaAs or InAs. The term "n-type" refers to the addition of impurities that contributes free electrons to an intrinsic semiconductor material. Exemplary n-type dopants include, but are not limited to, Si, Ge, Sn and Te. The concentration of n-type dopants that can be present in each source/drain structure 22 may be in a range from 5E18 atoms/cm$^3$ to 1.5E21 atoms/cm$^3$.

Each source/drain structure 22 may be formed utilizing an epitaxial growth (or deposition) process. The terms "epitaxial growth and/or deposition" and "epitaxially formed and/or grown" mean the growth of a semiconductor material on a deposition surface of a semiconductor material, in which the semiconductor material being grown has the same crystalline characteristics as the semiconductor material of the deposition surface. In an epitaxial deposition process, the chemical reactants provided by the source gases are controlled and the system parameters are set so that the depositing atoms arrive at the deposition surface of the semiconductor substrate with sufficient energy to move around on the surface and orient themselves to the crystal arrangement of the atoms of the deposition surface. Therefore, an epitaxial semiconductor material has the same crystalline characteristics (and can be said to be epitaxially aligned) as the deposition surface on which it is formed. For example, an epitaxial semiconductor material deposited on a {111} crystal surface will take on a {111} orientation. As such, each source/drain structure 22 has an epitaxial relationship with the sidewall surface of the semiconductor material portion 14P. In some embodiments, the epitaxial growth process used in providing each source/drain structure 22 is a selective epitaxial growth process; in such an embodiment, semiconductor material is grown only from surfaces of a semiconductor material, not dielectric or conductive.

Examples of various epitaxial growth process apparatuses that can be employed in the present application include, e.g., rapid thermal chemical vapor deposition (RTCVD), low-energy plasma deposition (LEPD), metal organic chemical vapor deposition (MOCVD), ultra-high vacuum chemical vapor deposition (UHVCVD), atmospheric pressure chemical vapor deposition (APCVD) and molecular beam epitaxy (MBE). The temperature for epitaxial deposition typically ranges from 550° C. to 900° C. Although higher temperature typically results in faster deposition, the faster deposition may result in crystal defects and film cracking. The epitaxial growth can be performed utilizing any well known precursor gas or gas mixture. Carrier gases like hydrogen, nitrogen, helium and argon can be used.

The n-type dopant that can be present in each source/drain structure 22 is typically introduced into the precursor gas or gas mixture during the epitaxial growth process. In other embodiments, the n-type dopant can be introduced after the epitaxial growth process utilizing one of ion implantation or gas phase doping.

Referring now to FIGS. 7A-7D, there is illustrated various views of the exemplary semiconductor structure of FIGS. 6A-6D removing exposed portions of the at least one patterned material stack (14P, 16) that are not protected by a sacrificial gate structure 18. After removal, a portion of the hard mask 16 and a portion of the semiconductor material portion 14P remain beneath each sacrificial gate structure 18. Each remaining portion of the hard mask 16 may be referred to as a hard mask portion 16P, while each remaining portion of the semiconductor material portion 14P may be referred to as a semiconductor mandrel 14M. In embodiments in which no hard mask layer is employed, only the semiconductor mandrel 14M would remain beneath each sacrificial gate structure 18. The removal of the exposed portions of the at least one patterned material stack (14P, 16) that are not protected by a sacrificial gate structure 18 may be performed utilizing one or more anisotropic etching processes.

Referring now to FIGS. 8A-8D, there is illustrated various views of the exemplary semiconductor structure of FIGS. 7A-7D after forming a middle-of-the-line (MOL) dielectric material 24, the MOL dielectric material 24 laterally surrounding each sacrificial gate structure 18 and has a topmost surface that is coplanar with the topmost surface of each sacrificial gate structure 18.

The MOL dielectric material 24 may be composed of one of dielectric materials mentioned above for dielectric material layer 20. The MOL dielectric material 24 may be formed using one of the techniques mentioned above for forming dielectric material layer 20. The MOL dielectric material 24 may have a thickness from 80 nm to 500 nm. Other thicknesses that are greater or lesser than the range provided above can also be used for the MOL dielectric material 24.

Referring now to FIGS. 9A-9D, there are illustrated various views of the exemplary semiconductor structure of FIGS. 8A-8D after removing each sacrificial gate structure 18. A cavity 25 is formed in areas in which a sacrificial gate structure 18 has been removed. Each cavity 25 represents an area in which a III-V compound semiconductor channel material can be subsequently formed. Each sacrificial gate structure 18 can be removed utilizing one or more anisotropic etching processes.

Referring now to FIGS. 10A-10D, there is illustrated various views of the exemplary semiconductor structure of FIGS. 9A-9D after forming a III-V compound semiconductor channel material 26 from exposed portions of each remaining portion of the semiconductor material layer (i.e., from at least one exposed sidewall of each semiconductor mandrel 14M). Each III-V compound semiconductor channel material 26 may be formed utilizing an epitaxial growth or deposition process as mentioned and described above. In some embodiments, the epitaxial growth process used in providing each III-V compound semiconductor channel material 26 is a selective epitaxial growth process; in such an embodiment, semiconductor material is grown only from surfaces of a semiconductor material, not dielectric or conductive.

In some instance, a pair of III-V compound semiconductor channel materials 26 is formed on opposing sidewalls of a semiconductor mandrel 14M. Each III-V compound semiconductor channel material 26 is composed of a different semiconductor material than each semiconductor mandrel 14M. In one embodiment, each III-V compound semiconductor channel material 26 is grown from a (111) sidewall of a silicon mandrel. Each III-V compound semiconductor channel material 26 has a topmost surface that is coplanar with a topmost surface of each semiconductor mandrel 14M.

Figure 10A:
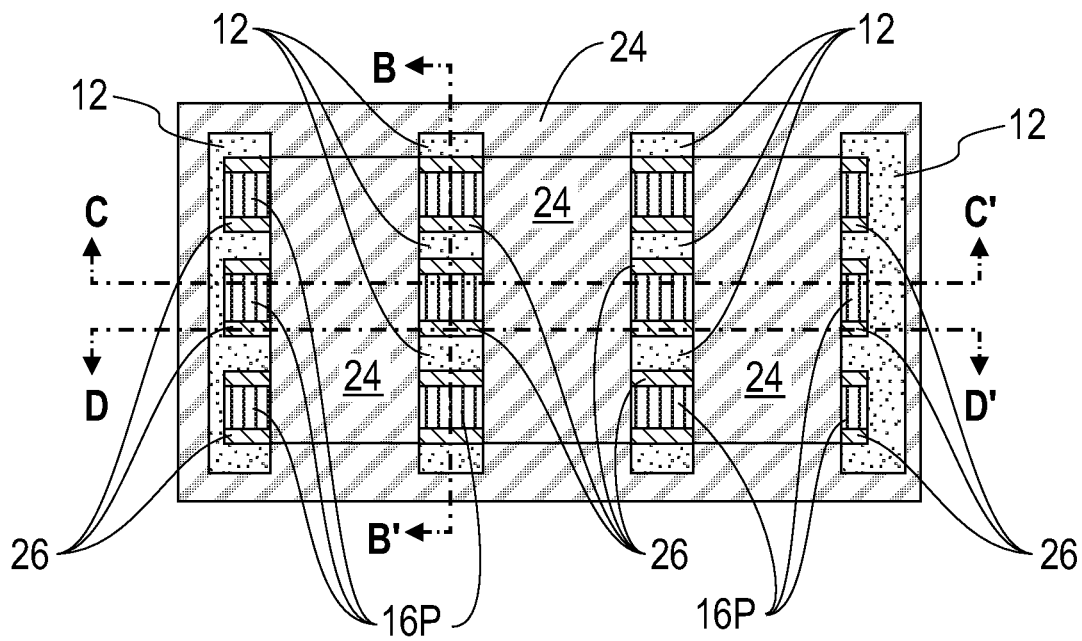
FIG. 10A is a top-down view of the exemplary semiconductor structure of FIGS. 9A-9D after forming a III-V compound semiconductor channel material from exposed portions of each remaining portion of the semiconductor material layer (i.e., from exposed sidewalls of each semiconductor mandrel provided in FIGS. 7A-7D).
Figure 10B:
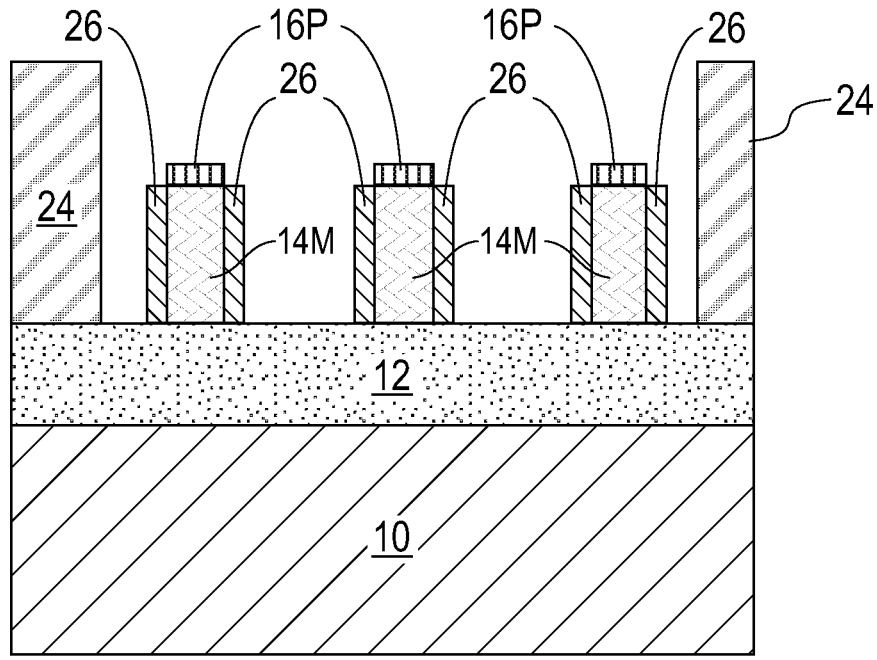
FIG. 10B is a cross sectional view of the exemplary semiconductor structure of FIG. 10A along vertical plane B-B'.
Figure 10C:
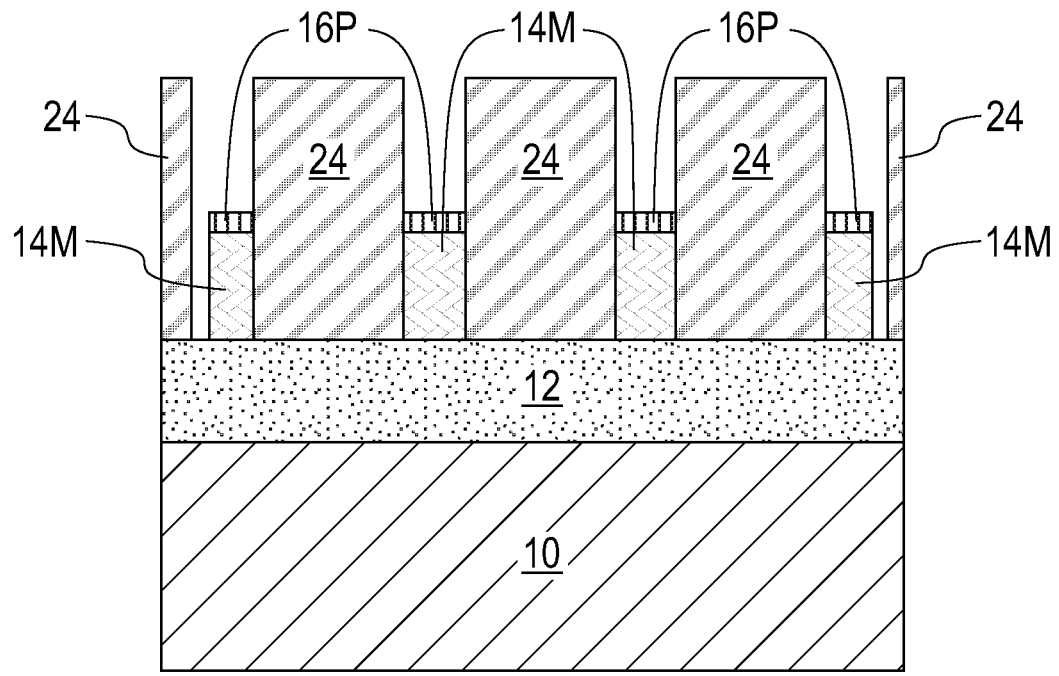
FIG. 10C is a cross sectional view of the exemplary semiconductor structure of FIG. 10A along vertical plane C-C'.
Figure 10D:
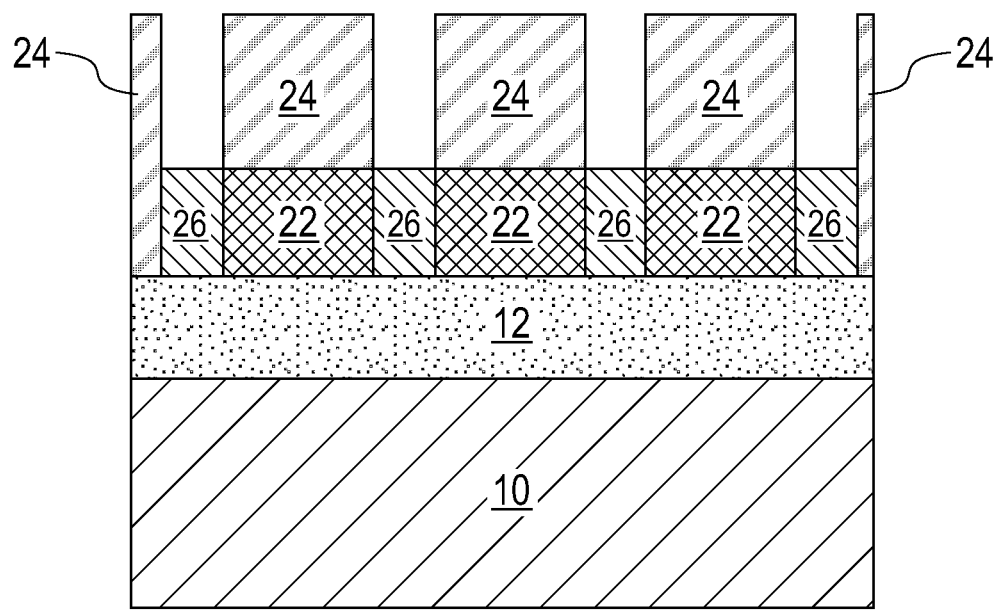
FIG. 10D is a cross sectional view of the exemplary semiconductor structure of FIG. 10A along vertical plane D-D'.
Figure 11A:
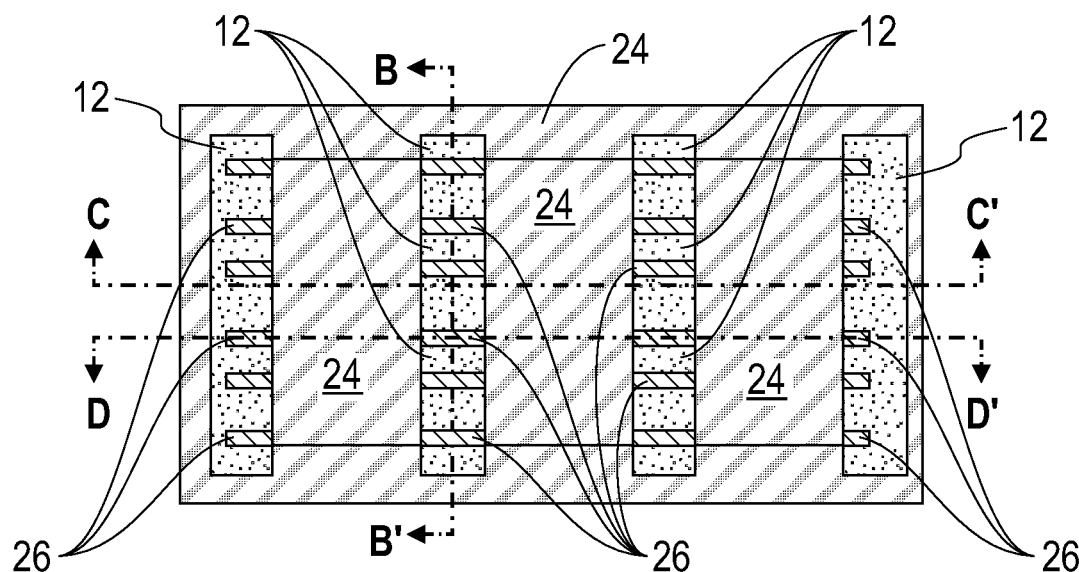
FIG. 11A is a top-down view of the exemplary semiconductor structure of FIGS. 10A-10D after removing each remaining portions of each hard mask and each semiconductor mandrel.
Figure 11B:
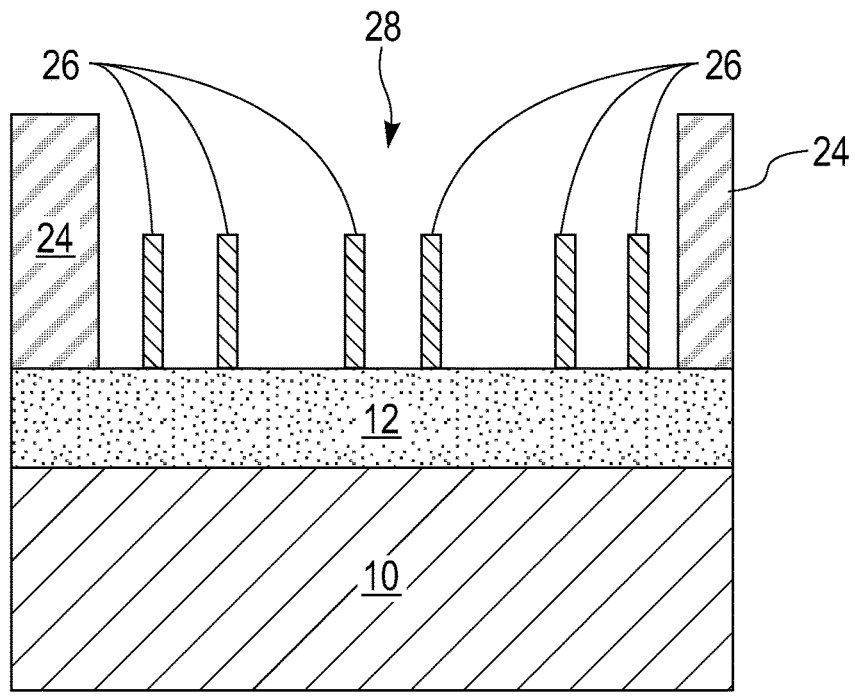
FIG. 11B is a cross sectional view of the exemplary semiconductor structure of FIG. 11A along vertical plane B-B'.
Figure 11C:
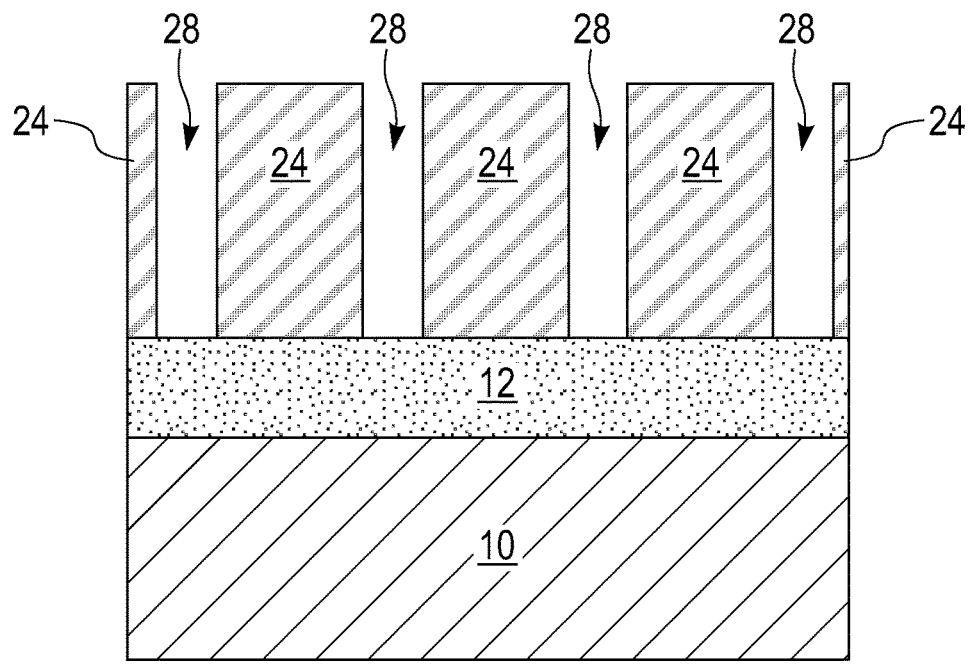
FIG. 11C is a cross sectional view of the exemplary semiconductor structure of FIG. 11A along vertical plane C-C'.
Figure 11D:
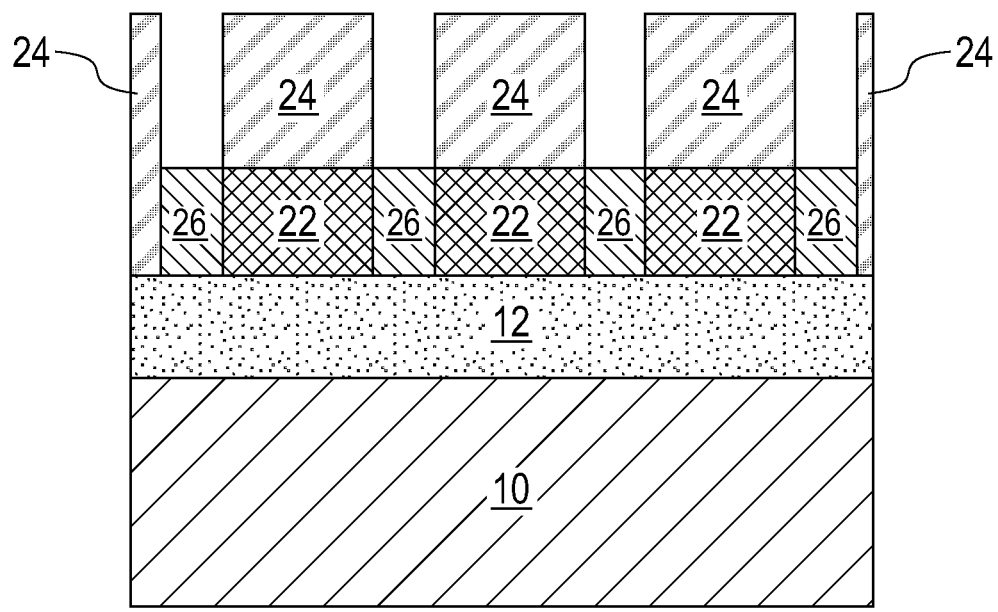
FIG. 11D is a cross sectional view of the exemplary semiconductor structure of FIG. 11A along vertical plane D-D'.
Figure 12A:
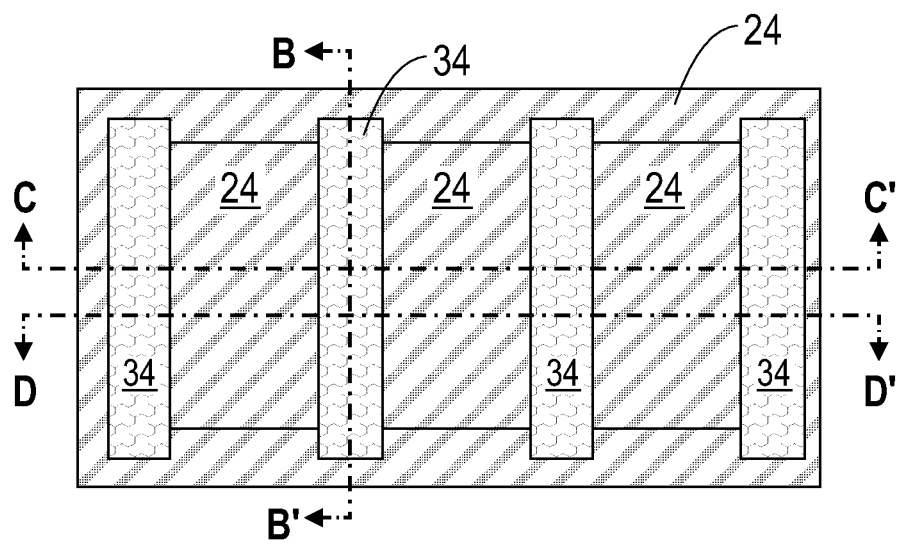
FIG. 12A is a top-down view of the exemplary semiconductor structure of FIGS. 11A-11D after forming a functional gate structure in the gate cavity.
Figure 12B:
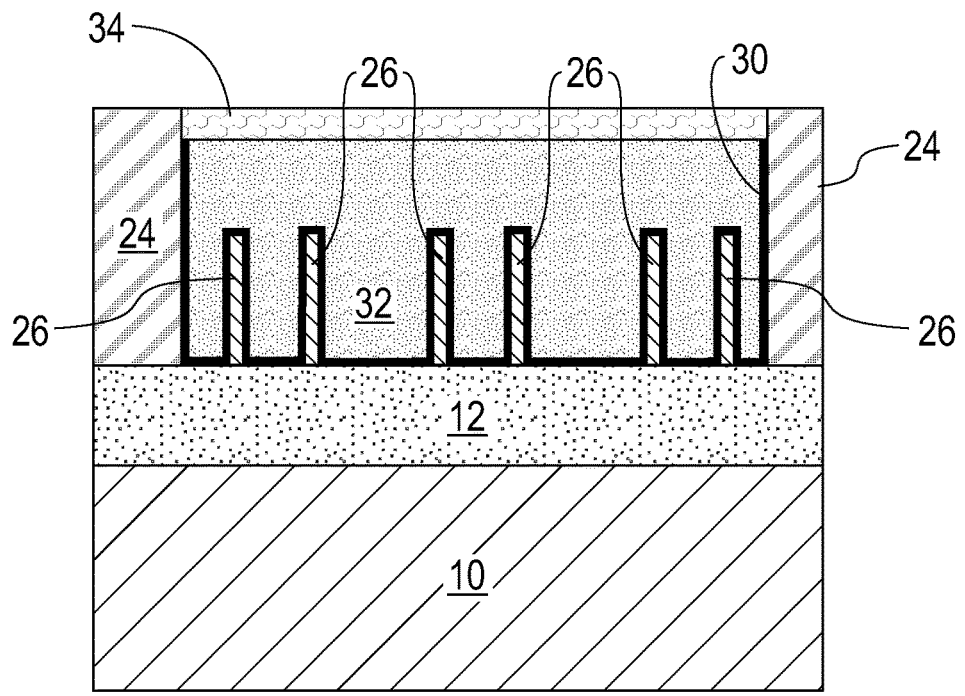
FIG. 12B is a cross sectional view of the exemplary semiconductor structure of FIG. 12A along vertical plane B-B'.
Figure 12C:
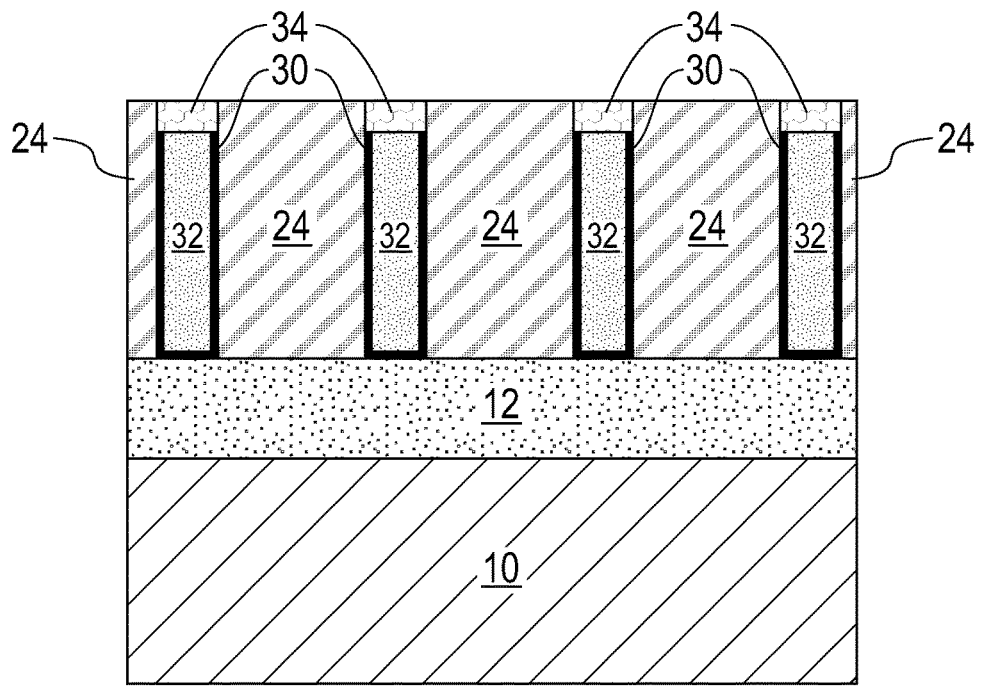
FIG. 12C is a cross sectional view of the exemplary semiconductor structure of FIG. 12A along vertical plane C-C'.
Figure 12D:
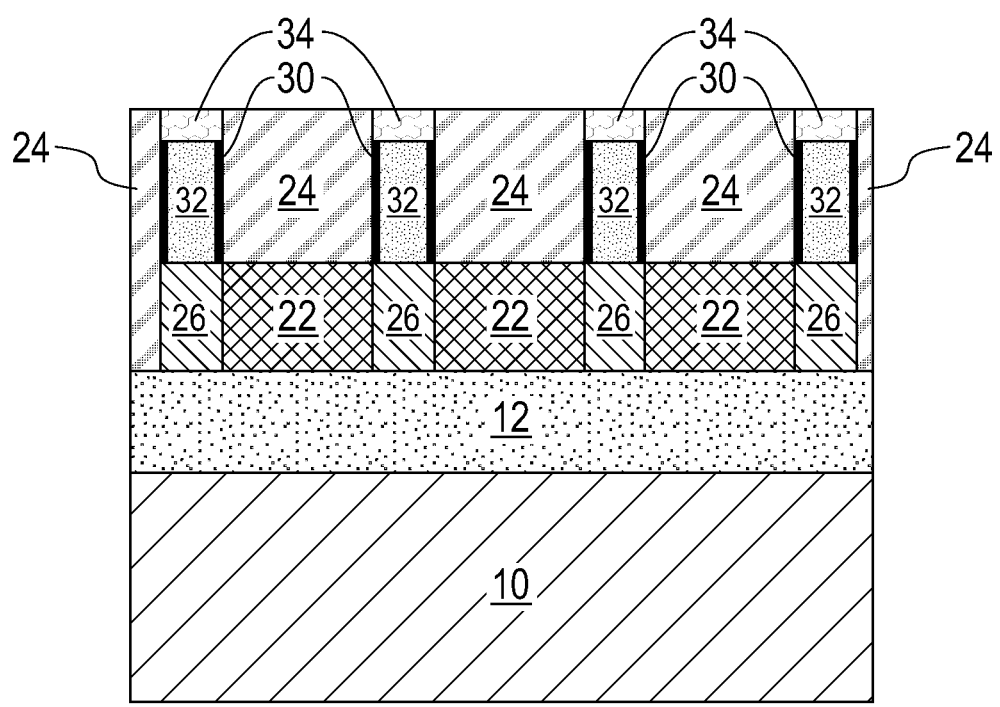
FIG. 12D is a cross sectional view of the exemplary semiconductor structure of FIG. 12A along vertical plane D-D'.

In some embodiment, each III-V compound semiconductor channel material 26 has a bottommost surface that contacts a topmost surface of insulator layer 12. When a bulk semiconductor substrate is used in the present application, each III-V compound semiconductor channel material 26 has a bottommost surface that contacts a topmost surface of a remaining portion of the bulk semiconductor substrate. In some embodiments, and as is shown in FIG. 10D, each III-V compound semiconductor channel material 26 has a topmost surface that is coplanar with a topmost surface of each source/drain structure 22 and a bottommost surface that is also coplanar with a bottommost surface of each source/drain structure 22.

In some embodiments, each III-V compound semiconductor channel material 26 may include a p-type dopant. By "p-type" refers to the addition of impurities to an intrinsic semiconductor material that creates deficiency of valence electrons. The p-type dopant may be introduced into III-V compound semiconductor channel material 26 during the epitaxial growth process or after utilizing one of ion implantation or gas phase doping. The amount of p-type dopant that can be present in each III-V compound semiconductor channel material 26 may be from 1E16 atoms/cm$^3$ to 1E18 atoms/cm$^3$.

Each III-V compound semiconductor channel material 26 may be referred to as a III-V body or channel region. Each III-V compound semiconductor channel material 26 may have a width from 2 nm to 20 nm, and each III-V compound semiconductor channel material 26 may have a height from 10 nm to 100 nm.

Referring now to FIGS. 11A-11D, there is illustrated various views of the exemplary semiconductor structure of FIGS. 10A-10D after removing each remaining portion of the hard mask (i.e., each hard mask portion 14P) and each semiconductor mandrel 14M forming a gate cavity 28. Each gate cavity 28 represents an area in which a functional gate structure will be subsequently formed. Each remaining portion of the hard mask (i.e., each hard mask portion 14P) and each semiconductor mandrel 14M can be removed utilizing one or more anisotropic etching processes.

Referring now to FIGS. 12A-12D, there are illustrated various views of the exemplary semiconductor structure of FIGS. 11A-11D after forming a functional gate structure in the gate cavity 28. Each functional gate structure includes a gate material stack of, from bottom to top, a gate dielectric portion 30 and a gate conductor portion 32. In some embodiments, a gate cap portion 34 can be present atop at least the gate conductor portion 32. Each gate dielectric portion 30 may be U-shaped (i.e., it has a horizontal portion and two vertical portions that extend upward from each end of the horizontal portion). Each functional gate structure has a topmost surface that is coplanar with the MOL dielectric material 24.

Each gate dielectric portion 30 may include a gate dielectric material. The gate dielectric material that provides each gate dielectric portion 30 can be an oxide, nitride, and/or oxynitride. In one example, the gate dielectric material that provides each gate dielectric portion 30 can be a high-k material having a dielectric constant greater than silicon dioxide. Exemplary high-k dielectrics include, but are not limited to, $HfO_2$, $ZrO_2$, $La_2O_3$, $Al_2O_3$, $TiO_2$, $SrTiO_3$, $LaAlO_3$, $Y_2O_3$, $HfO_xN_y$, $ZrO_xN_y$, $La_2O_xN_y$, $Al_2O_xN_y$, $TiO_xN_y$, $SrTiO_xN_y$, $LaAlO_xN_y$, $Y_2O_xN_y$, $SiON$, $SiN_x$, a silicate thereof, and an alloy thereof. Each value of x is independently from 0.5 to 3 and each value of y is independently from 0 to 2. In some embodiments, a multilayered gate dielectric structure comprising different gate dielectric materials, e.g., silicon dioxide, and a high-k gate dielectric, can be formed and used as each gate dielectric portion 30.

The gate dielectric material used in providing each gate dielectric portion 30 can be formed by any deposition process including, for example, chemical vapor deposition (CVD), plasma enhanced chemical vapor deposition (PECVD), physical vapor deposition (PVD), sputtering, or atomic layer deposition. In one embodiment of the present application, the gate dielectric material used in providing each gate dielectric portion 30 can have a thickness in a range from 1 nm to 10 nm. Other thicknesses that are lesser than, or greater than, the aforementioned thickness range can also be employed for the gate dielectric material that may provide each gate dielectric portion 30.

Each gate conductor portion 32 can include a gate conductor material. The gate conductor material used in providing each gate conductor portion 32 can include any conductive material including, for example, doped polysilicon, an elemental metal (e.g., tungsten, titanium, tantalum, aluminum, nickel, ruthenium, palladium and platinum), an alloy of at least two elemental metals, an elemental metal nitride (e.g., tungsten nitride, aluminum nitride, and titanium nitride), an elemental metal silicide (e.g., tungsten silicide, nickel silicide, and titanium silicide) or multilayered combinations thereof. The gate conductor portion 32 may also include a NFET gate metal.

The gate conductor material used in providing each gate conductor portion 32 can be formed utilizing a deposition process including, for example, chemical vapor deposition (CVD), plasma enhanced chemical vapor deposition (PECVD), physical vapor deposition (PVD), sputtering, atomic layer deposition (ALD) or other like deposition processes. When a metal silicide is formed, a conventional silicidation process is employed. In one embodiment, the gate conductor material used in providing each gate conductor portion 30 has a thickness from 20 nm to 150 nm. Other thicknesses that are lesser than, or greater than, the aforementioned thickness range can also be employed for the gate conductor material used in providing each gate conductor portion 32.

If present, gate cap portion 34 may include a gate cap material. The gate cap material that provides each gate cap portion 34 may include a hard mask material such as, for example, silicon dioxide, silicon nitride, and/or silicon oxynitride. The hard mask material that provides each gate cap portion 34 can be formed utilizing a conventional deposition process such as, for example, chemical vapor deposition or plasma enhanced chemical vapor deposition. The material that provides each gate cap portion 34 can have a thickness from 5 nm to 20 nm. Other thicknesses that are lesser than, or greater than, the aforementioned thickness range can also be employed as the thickness of the material that provides each gate cap portion 34.

The functional gate structure can be formed by providing a functional gate material stack of, from bottom to top, the gate dielectric material, the gate conductor material and, if present, the gate cap material. A planarization process may follow the deposition of the functional gate material stack. In another embodiment, the functional gate structure may be formed by providing a functional gate material stack of, from bottom to top, the gate dielectric material, and the gate conductor material. A planarization process may follow the deposition of the functional gate material stack. Next, an upper portion of the remaining gate conductor material is recessed and thereafter, the gate cap portion 34 can be formed on recessed portion of the gate conductor material.

At this point of the present application, contact structures can be formed into the MOL dielectric material utilizing conventional techniques well known to those skilled in the art. After contact structure formation, conventional interconnect structures as known to those skilled in the art can be formed atop the MOL dielectric material.

Although the above embodiment depicts and illustrates the channel growth after MOL dielectric material formation is performed on the NFET device region, while the PFET device region gets normal processing, it is also possible to reverse the two device roles.

While the present application has been particularly shown and described with respect to preferred embodiments thereof, it will be understood by those skilled in the art that the foregoing and other changes in forms and details may be made without departing from the spirit and scope of the present application. It is therefore intended that the present application not be limited to the exact forms and details described and illustrated, but fall within the scope of the appended claims.

What is claimed is:

1. A method of forming a semiconductor structure, said method comprising:
   providing, in an NFET device region, at least one sacrificial gate structure straddling over a portion of at least semiconductor material portion;
   forming a source/drain structure from exposed sidewalls of each semiconductor material portion;
   removing said at least one semiconductor material portion not protected by said at least one sacrificial gate structure, while maintaining at least a semiconductor mandrel beneath each sacrificial gate structure, each semiconductor mandrel comprises a remaining portion of said semiconductor material portion;
   forming a middle-of-the-line (MOL) dielectric material laterally surrounding each sacrificial gate structure and atop each source/drain structure, wherein said MOL dielectric material has a topmost surface that is coplanar with each sacrificial gate structure;
   removing each sacrificial gate structure to provide a cavity, said cavity exposing at least one sidewall of each semiconductor mandrel;
   forming a III-V compound semiconductor channel material from said at least one sidewall of each semiconductor mandrel;
   removing each semiconductor mandrel to provide a gate cavity; and
   forming a functional gate structure in each gate cavity.

2. The method of claim 1, wherein said forming said source/drain structure comprises a selective epitaxial growth process.

3. The method of claim 1, wherein said source/drain structure comprises a semiconductor material containing an n-type dopant.

4. The method of claim 1, further comprising forming at least one PFET device in a PFET device region that lies to a periphery of said NFET device region, said forming said PFET device is performed prior to forming said source/drain structure.

5. The method of claim 4, wherein said forming said PFET device region comprising:
   forming a dielectric material layer on said NFET device region and said PFET device region; and
   forming said PFET device utilizing a replacement gate process; and
   removing said dielectric material layer from said NFET device region.

6. The method of claim 1, wherein said removing said semiconductor material portion not protected by said at least one sacrificial gate structure comprises at least one anisotropic etch.

7. The method of claim 1, wherein each semiconductor material portion is a lower layer of a patterned material stack, said patterned material stack further comprises a hard mask located on each semiconductor material portion, and wherein said hard mask not protected by said at least one sacrificial gate structure is removed during said removing said at least one semiconductor material portion not protected by said at least one sacrificial gate structure.

8. The method of claim 1, wherein said forming said III-V compound semiconductor channel material comprises a selective epitaxial growth process.

9. The method of claim 1, wherein each semiconductor mandrel comprises Si, and said at least one sidewall of each semiconductor mandrel has a (111) crystal orientation.

10. The method of claim 1, wherein said removing each semiconductor mandrel comprises at least one anisotropic etch.

11. The method of claim 1, wherein each III-V compound semiconductor channel material further comprises a p-type.

12. The method of claim 1, wherein each III-V compound semiconductor channel material has a topmost surface and a bottommost surface that are coplanar with a topmost surface and a bottommost surface, respectively, of each source/drain structure.

13. The method of claim 1, wherein said functional gate structure has a topmost surface that is coplanar with a topmost surface of said MOL dielectric material.

14. The method of claim 13, wherein said functional gate structure comprises a U-shaped gate dielectric portion.

15. The method of claim 1, wherein each III-V compound semiconductor channel material has a width from 2 nm to 20 nm and a height from 10 nm to 100 nm.

16. The method of claim 1, further comprising a substrate located beneath said at least one sacrificial gate structure and said at least one semiconductor material portion.

17. The method of claim 16, wherein said substrate is an insulator layer or a remaining portion of a bulk semiconductor substrate.

18. The method of claim 1, wherein each semiconductor material portion is formed by:
   providing a material stack, of from bottom to top, a semiconductor material layer and a hard mask layer; and
   patterning said material stack.

19. The method of claim 1, wherein each sacrificial gate structure lies perpendicular to each semiconductor material portion.

20. The method of claim 1, wherein said removing each sacrificial gate structure comprises one or more anisotropic etching processes.

* * * * *